(12) United States Patent
Ohara

(10) Patent No.: US 8,833,179 B2
(45) Date of Patent: Sep. 16, 2014

(54) PRESSING TYPE INPUT DEVICE

(71) Applicant: Alps Electric Co., Ltd., Tokyo (JP)

(72) Inventor: Hiroshi Ohara, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/939,087

(22) Filed: Jul. 10, 2013

(65) Prior Publication Data

US 2013/0291655 A1 Nov. 7, 2013

Related U.S. Application Data

(63) Continuation of application No. PCT/JP2012/050091, filed on Jan. 5, 2012.

(30) Foreign Application Priority Data

Jan. 12, 2011 (JP) .................................. 2011-004213

(51) Int. Cl.
*G01D 7/00* (2006.01)
*G01L 3/00* (2006.01)
*H01H 13/84* (2006.01)
*G01L 5/22* (2006.01)

(52) U.S. Cl.
CPC ................ *G01L 5/228* (2013.01); *H01H 13/84* (2013.01); *H01H 2227/034* (2013.01); *H01H 2225/028* (2013.01); *H01H 2221/064* (2013.01)
USPC .................................................. 73/862.046

(58) Field of Classification Search
USPC ............................................ 73/862.046, 862
See application file for complete search history.

(56) References Cited

U.S. PATENT DOCUMENTS

| 7,183,948 | B2 | 2/2007 | Roberts | |
|---|---|---|---|---|
| 7,434,459 | B2 * | 10/2008 | Schmidt et al. | 73/172 |
| 8,635,919 | B2 * | 1/2014 | Suzuki et al. | 73/862.627 |
| 2002/0163509 | A1 * | 11/2002 | Roberts | 345/173 |

FOREIGN PATENT DOCUMENTS

| JP | 2001-311937 | 11/2001 |
|---|---|---|
| JP | 2007-64786 | 3/2007 |

OTHER PUBLICATIONS

Search Report dated Apr. 10, 2012 from International Application No. PCT/JP2012/050091.

* cited by examiner

*Primary Examiner* — Lisa Caputo
*Assistant Examiner* — Jamel Williams
(74) *Attorney, Agent, or Firm* — Beyer Law Group LLP

(57) ABSTRACT

To provide a pressing type input device including: a load sensor which outputs a signal corresponding to an operation load from an operation member; a biasing member which generates an initial load with respect to the load sensor; a pressing member which presses the load sensor by receiving a biasing force of the biasing member; and a support member which oscillatably supports the pressing member, in which the pressing member has a pressed portion to receive the operation load from the operation member and a press portion to press the load sensor, and the operation load applied to the pressed portion causes a force to act on the press portion in a direction to reduce the initial load on the load sensor, in a position supported by the support member as fulcrum.

14 Claims, 14 Drawing Sheets

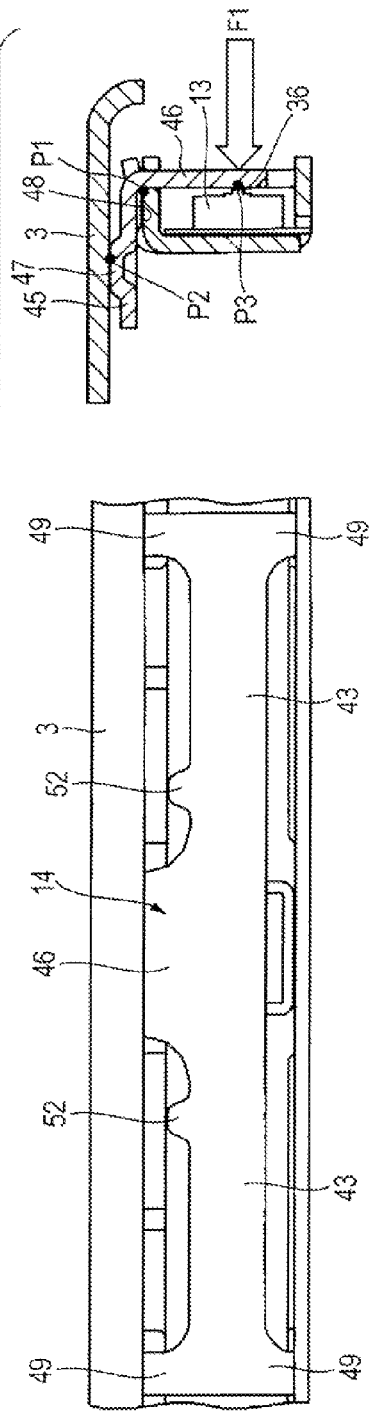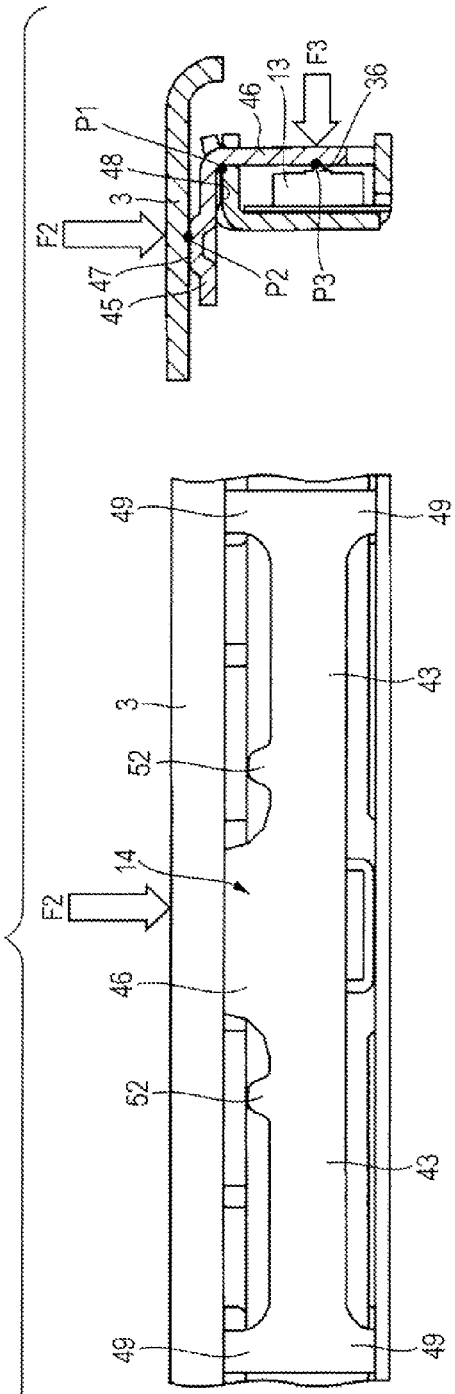
FIG. 5A
FIG. 5B

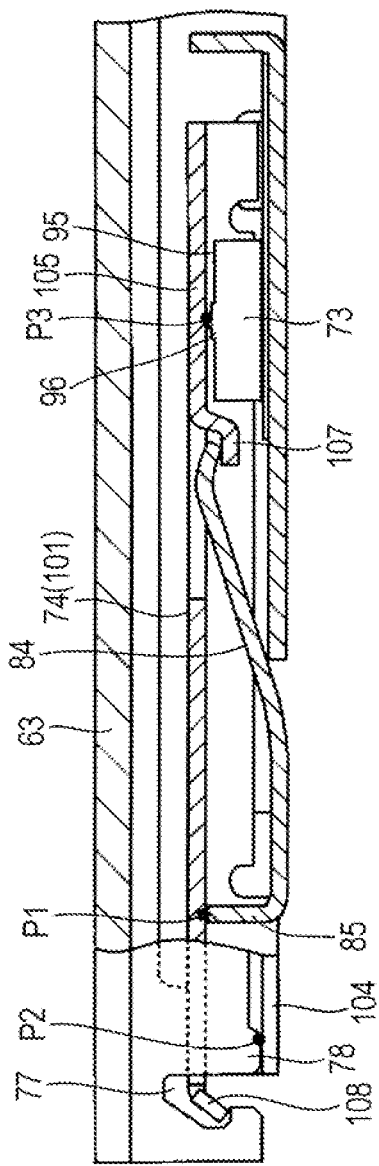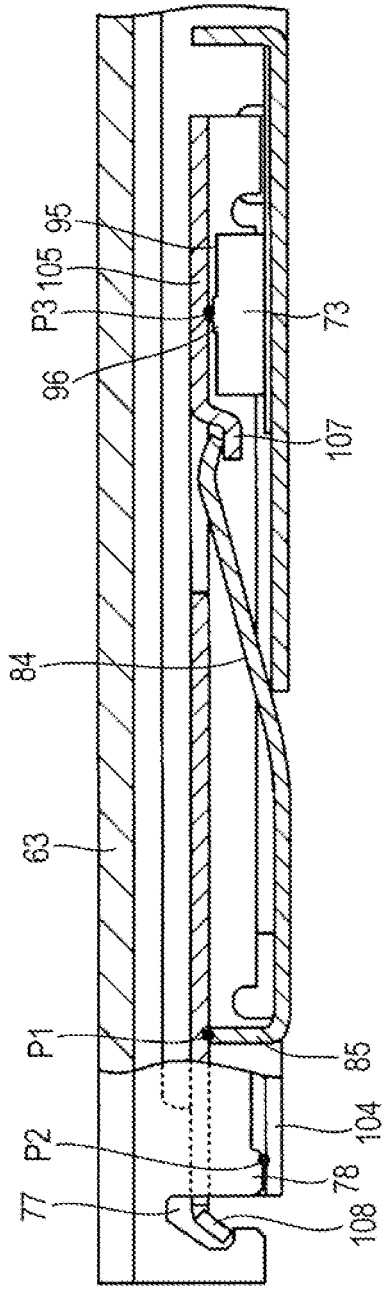

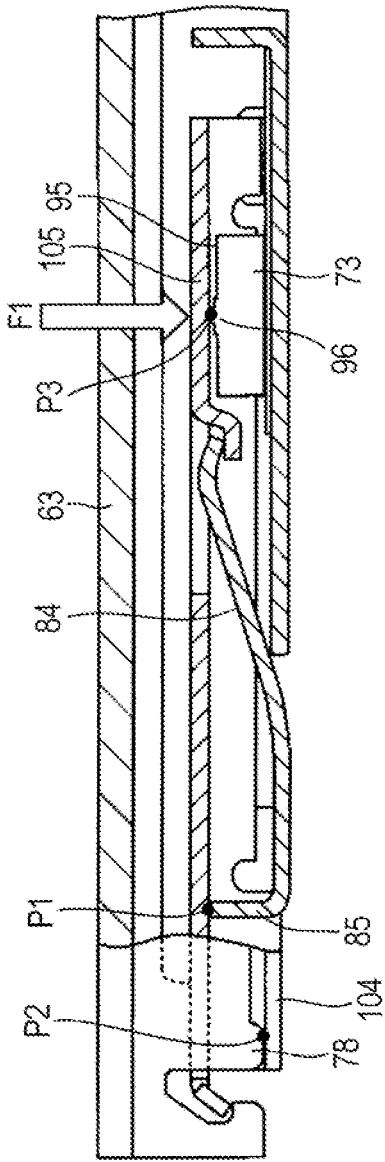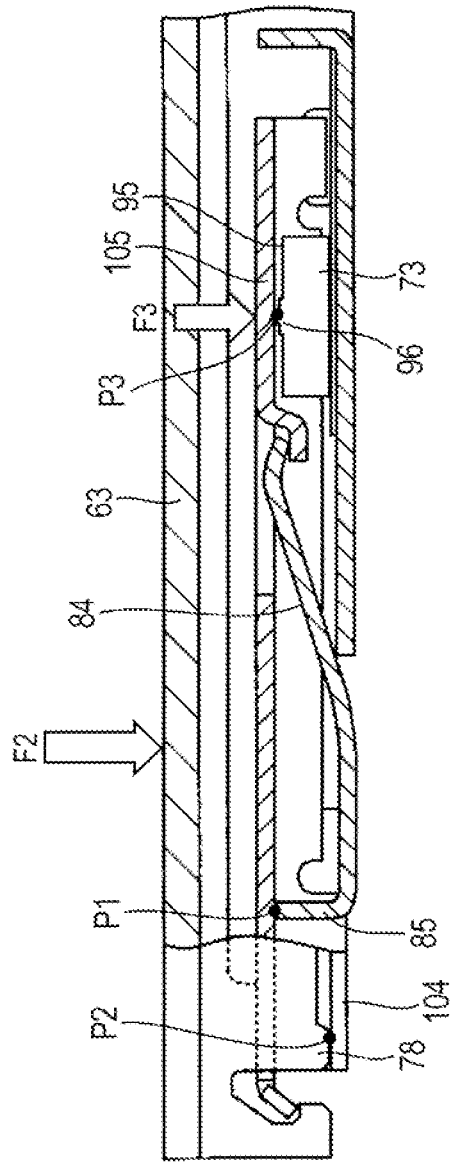

PRESSING TYPE INPUT DEVICE

CLAIM OF PRIORITY

This application is a Continuation of International Application No. PCT/JP2012/050091 filed on Jan. 5, 2012, which claims benefit of Japanese Patent Application No. 2011-004213 filed on Jan. 12, 2011. The entire contents of each application noted above are hereby incorporated by reference.

BACKGROUND OF THE INVENTION

1. Field of the Invention

The present invention relates to a pressing type input device and particularly relates to a pressing type input device used when operating a portable terminal such as a mobile phone.

2. Description of the Related Art

As a pressing type input device, a device which detects a press position based on a pressing load applied to a touch screen of a portable terminal has been proposed in the related art (see PCT Japanese Translation Patent Publication No. 2008-527620). This type of pressing type input device has a configuration in which load sensors are provided at four corners on a rear surface of the touch screen, for example. The pressing type input device receives the load applied to the touch screen by each of the load sensors and specifies the press position based on a change of pressure distribution detected by each of the load sensors.

However, in the pressing type input device according to the related art, the pressing load is directly applied to the load sensors on the touch screen. Therefore, there is a possibility that the load sensor may be damaged if large load is applied thereto. Particularly, the load sensor using piezoelectric ceramics gets easily damaged.

SUMMARY OF THE INVENTION

The present invention has been made under consideration of the above described circumstances. The present invention provides a pressing type input device capable of preventing damage of a load sensor even when overload is applied thereto.

According to an aspect of the present invention, there is provided a pressing type input device including: a load sensor which outputs a signal corresponding to an operation load from an operation member; a biasing member which generates an initial load with respect to the load sensor; a pressing member which presses the load sensor by receiving a biasing force of the biasing member; and a support member which oscillatably supports the pressing member, in which the pressing member has a pressed portion to receive the operation load from the operation member and a press portion to press the load sensor, and the operation load applied to the pressed portion causes a force to act on the press portion in a direction to reduce the initial load on the load sensor, in a position supported by the support member as fulcrum.

According to the configuration described above, since the initial load acting on the load sensor by the operation load from the operation member is reduced, it is possible to prevent the load sensor from being damaged even when overload is applied to the operation member. In addition, it is possible to adjust detection accuracy and to adopt load sensor in various load ratings, by changing either one of a distance between the pressed position to which the operation load is applied and a fulcrum or a distance between the press position to which the initial load is applied and the fulcrum. Therefore it is possible to improve design freedom. For example, it is possible to reduce a force acting on the press portion, by lengthening the distance between the press position and the fulcrum with respect to the distance between the pressed position and the fulcrum. Therefore, it is possible to use a load sensor having a small load rating.

In the aspect of the present invention, it is preferable that the support member support a position between the pressed portion and the press portion in the pressing member.

According to the configuration described above, since the fulcrum is disposed between the pressed portion and the press portion, it is possible to oscillatably support the pressing member by a simple configuration.

In the aspect of the present invention, it is preferable that the load sensor be disposed such that a detecting surface thereof is directed in a direction substantially perpendicular to an operation direction of the operation member. In addition, the pressing member may have a plate shape of which a plate surface of the pressed portion is opposite to the operation member, and a plate surface of the press portion is substantially perpendicular to the plate surface of the pressed portion so as to be opposite to the detecting surface of the load sensor.

According to the configuration described above, it is possible to cause the operation load from the operation member to act on the load sensor after converting the direction thereof in a substantially perpendicular direction.

In the aspect of the present invention, it is preferable that the biasing members be a pair of elastic arm portions extending from both sides of the press portion interposing a connection position between the pressed portion and the press portion. In addition, the support member may be provided with a pair of locking portions to lock free end sides of a pair of elastic arm portions. Further, the pair of elastic arm portions may pull the press portion on the load sensor side to generate the initial load by locking the free end sides of the pair of elastic arm portions in the pair of locking portions.

According to the configuration described above, since the biasing member is constituted by the pair of elastic arm portions continuous to the press portion, it is possible to improve productivity by reducing the number of parts. In addition, since the press portion is supported in both ends thereof by the pair of elastic arm portions, it is possible to generate the stable initial load to the load sensor.

In the aspect of the present invention, it is preferable that the pressing member have a pair of extension portions which interpose with the connection position between the pressed portion and the press portion and extend from both sides of the pressed portion. Further, the pair of extension portions may be supported by the support member.

According to the configuration described above, the pair of extension portions extending from both sides of the pressed portion cause the pressing member to be supported by the support member in two places. Therefore, it is possible to stabilize oscillation of the pressing member.

In the aspect of the present invention, it is preferable that a plurality of groups constituted by the load sensors having the common support member, the pressing member and the biasing member may be provided. Further, an operation position corresponding to the pressing member and an operation position corresponding to the adjacent pressing members in the operation member may be specified, based on outputs from a plurality of load sensors.

According to the configuration described above, not only a position corresponding to the pressing member but also at a position between the adjacent pressing members can be set as the operation position of the operation member. In addition, it is possible to reduce the number of load sensors or the likes smaller than the number of operation positions set to the operation member, and further the support member is used in common. Therefore, it is possible to improve the productivity by reducing the number of parts.

In the aspect of the present invention, it is preferable that the load sensor be disposed such that a detecting surface thereof is directed in the operation direction of the operation member. Further, the pressing member may have a plate shape of which a plate surface of the pressed portion is opposite to the operation member, and a plate surface of the press portion is substantially parallel to the plate surface of the pressed portion so as to be opposite to the detecting surface of the load sensor.

According to the configuration described above, it is possible to cause the operation load from the operation member to act on the load sensor, without changing the direction thereof. Therefore, it is possible for the pressing type input device to have a simpler design.

In the aspect of the present invention, it is preferable that the biasing member may be an elastic arm portion extending from the support member toward the press portion. In addition, the pressing member may be provided with a locking portion to lock a free end side of the elastic arm portion. Further, the elastic arm portion may pull the press portion on the load sensor side to generate the initial load by locking the free end side of the elastic arm portion in the locking portion.

According to the configuration described above, since the biasing member is constituted by the elastic arm portion continuous to the support member, it is possible to improve the productivity by reducing the number of parts.

In the aspect of the present invention, it is preferable that the support member may be provided with a positioning hole for positioning the pressing member. In addition, the pressing member is formed of a plate material having a lengthy plate surface and a pair of opposing surfaces which are continuous at both ends of the lengthy plate surface along a longitudinal direction and substantially perpendicular to the lengthy plate surface, and may have a positioning piece which is positionably held by the positioning hole.

According to the configuration described above, rigidity of the pressing member is increased by the pair of opposing surfaces. Therefore, the pressing member is positioned with respect to the support member, by the positioning hole and the positioning piece. Thus, it is possible to prevent the deterioration of the detection accuracy of the load sensor due to the bending of the pressing member, the positional deviation of the support member and the pressing member, or the like.

In the aspect of the present invention, it is preferable that a plurality of groups constituted by the load sensors having the common support member, the pressing member and the biasing member may be provided. Further, the operation position in the operation member may be specified, based on a rate of the outputs from the plurality of load sensors.

According to the configuration described above, since the operation position is specified based on the rate of output values from the plurality of load sensors, the operation position is set over the entire operation member. In addition, the support member is used in common. Therefore, it is possible to improve the productivity by reducing the number of parts.

In the aspect of the present invention, it is preferable that the load sensor may be disposed such that a detecting surface thereof is directed in a direction substantially perpendicular to an operation direction of the operation member. In addition, the pressing member may have a plate shape of which a plate surface on the pressed portion side is opposite to the operation member while interposing the fulcrum therebetween, and a plate surface on the press portion side is substantially perpendicular to the plate surface of the pressed portion so as to be opposite to the detecting surface of the load sensor.

According to the configuration described above, it is possible to cause the operation load from the operation member to act on the load sensor after converting the direction thereof in a substantially perpendicular direction.

In the aspect of the present invention, it is preferable that the biasing member may be a spring coil of which one end abuts on the plate surface of the pressing member on the press portion side, and the other end thereof abuts on a plate surface of the support member which is opposite to the plate surface on the press portion side. Further, the press portion may be pressed on the load sensor side by a spring force of the coil spring so as to generate an initial load thereto.

According to the configuration described above, since the biasing member is the coil spring which is provided separately from the pressing member and the support member, it is possible to easily adjust the initial load by replacing the coil spring.

In the aspect of the present invention, it is preferable that an accommodation space for the coil spring may be formed by the plate surface of the pressing member on the press portion side and the plate surface of the support member. In addition, the accommodation space for the coil spring has an open end.

According to the configuration described above, it is possible to mount the coil spring through the open end of the accommodation space. Therefore, it is easy to perform the mounting or replacing work of the coil spring.

In the aspect of the present invention, it is preferable that a plurality of groups constituted by the load sensor, the pressing member, the biasing member and the support member may be provided. Further, the operation position in the operation member may be specified, based on a rate of the outputs from the plurality of load sensors.

According to the configuration described above, since the operation position is specified base on the rate of the outputs from the plurality of load sensors, it is possible to set the operation position over the entire operation member.

According to the present invention, it is possible to prevent a load sensor from damage even when overload is applied to an operation member, and also it is possible to improve design freedom such that a load sensor in various load ratings can be adopted.

BRIEF DESCRIPTION OF THE DRAWINGS

FIGS. 5A and 5B are explanatory views of input operations of the pressing type input device showing the first embodiment of the pressing type input device according to the present invention.

FIGS. 9A and 9B are explanatory views of transmission structures of a load by a pressing plate showing the second embodiment of the pressing type input device according to the present invention.

FIGS. 10A and 10B are explanatory views of input operations of the pressing type input device showing the second embodiment of the pressing type input device according to the present invention.

DESCRIPTION OF THE PREFERRED EMBODIMENTS

Hereinafter, a first embodiment of the present invention will be described in detail with reference to accompanying drawings. Furthermore, a pressing type input device mounted in a portable terminal such as a mobile phone or a music player will be described in the following description. However, applicable objects of the pressing type input devices according to the embodiment are not limited thereto and can be modified appropriately.

Figure 1:
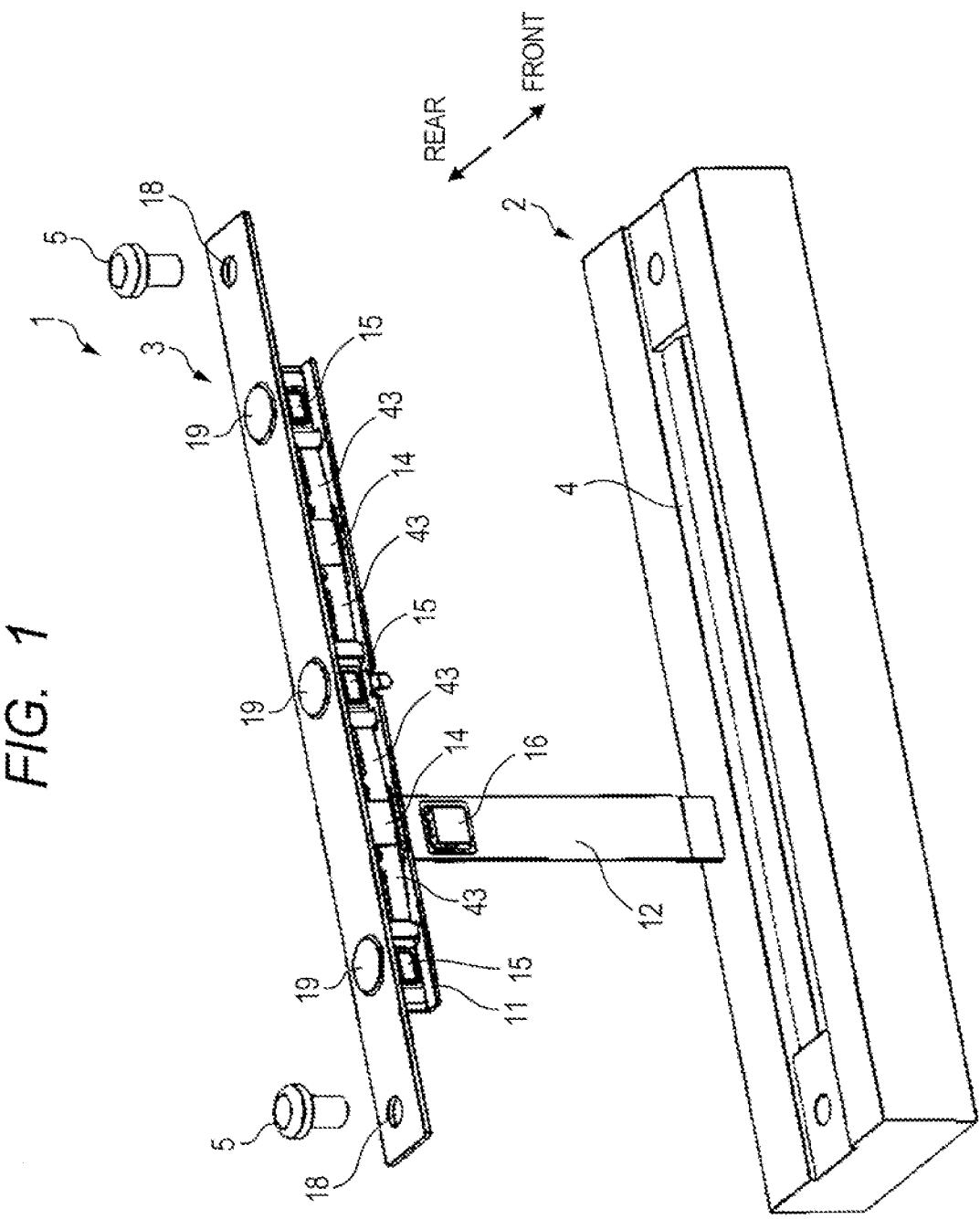
FIG. 1 is a perspective view of a pressing type input device showing a first embodiment of the pressing type input device according to the present invention.
Figure 2:
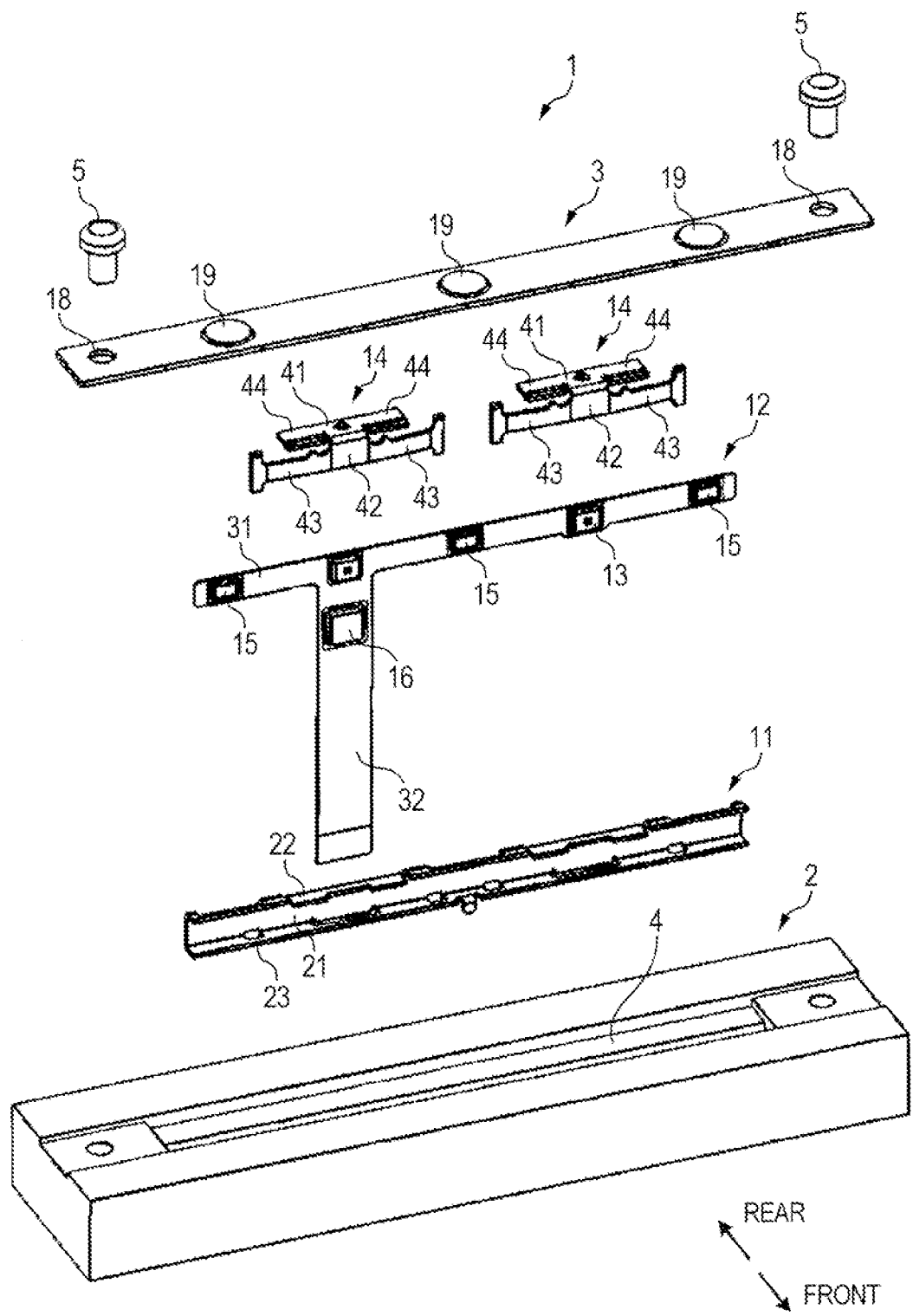
FIG. 2 is an exploded perspective view of the pressing type input device showing the first embodiment of the pressing type input device according to the present invention.
Figure 3A:
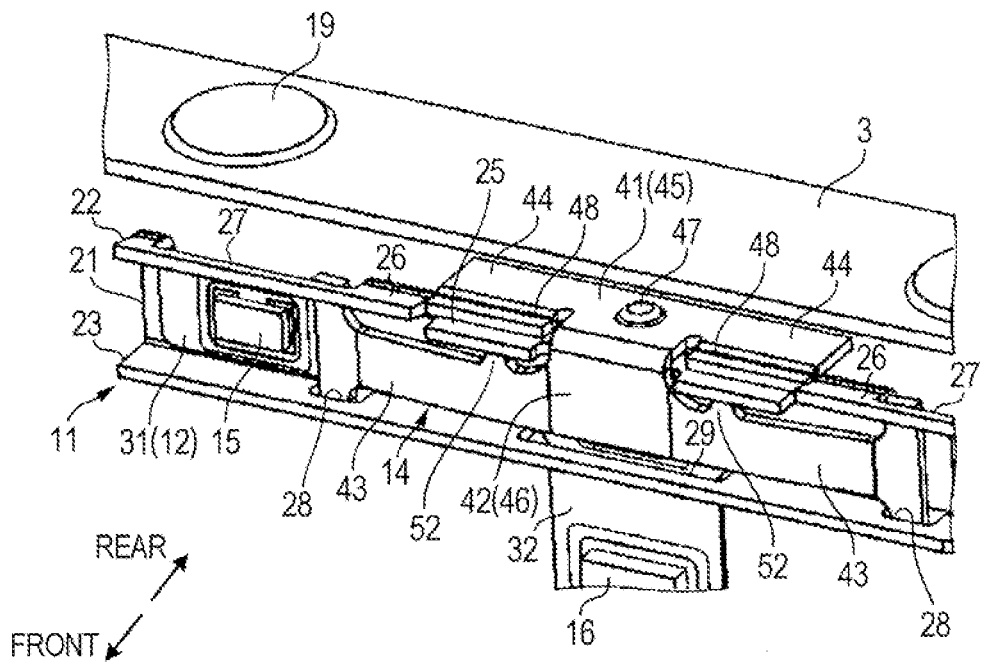
FIGS. 3A and 3B are partially enlarged views of the pressing type input device showing the first embodiment of the pressing type input device according to the present invention.
Figure 3B:
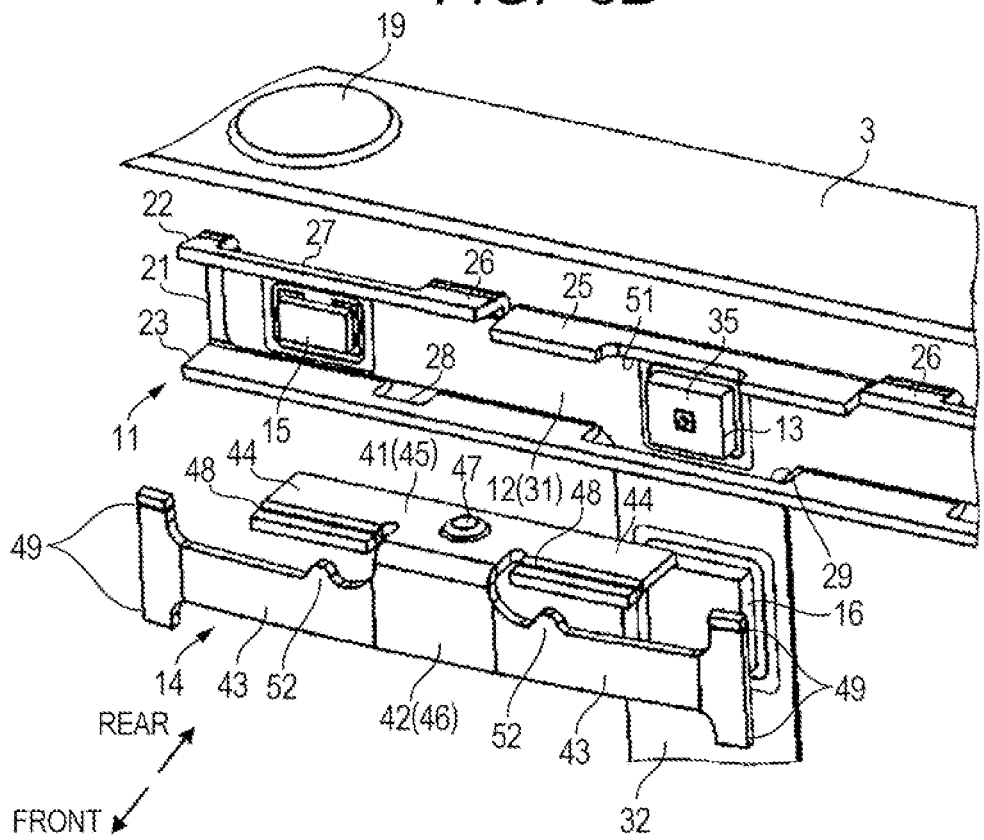

A whole structure of the pressing type input device will be described with reference to FIGS. 1 to 3B. FIG. 1 is a perspective view of the pressing type input device according to the first embodiment of the present invention. FIG. 2 is an exploded perspective view of the pressing type input device according to the first embodiment of the present invention. FIGS. 3A and 3B are partially enlarged views of the pressing type input device according to the first embodiment of the present invention. In addition, FIG. 3A shows a state where a pressing plate is mounted on a support member, and FIG. 3B shows a state where the pressing plate is removed from the support member.

As shown in FIGS. 1 to 3B, a pressing type input device 1 is mounted on a housing 2 of a portable terminal and is configured capable of inputting an operation position or an operation load with respect to an operation plate 3 to the portable terminal. The pressing type input device 1 is disposed in an accommodation portion 4 of the housing 2. Also, the operation plate 3 covering the accommodation portion 4 from the outside thereof is mounted on the housing 2 so as to be fixed to the housing 2 via a pair of bolts 5.

The pressing type input device 1 has a channel-shaped (groove-shaped) support member 11 having a box shape in cross-sectional view of which a side surface is opened. A pair of load sensors 13 are mounted on an inner-side surface of the support member 11, via a flexible substrate 12. Furthermore, a pair of pressing plates 14 which press each of the load sensors 13 provided in the inner-side surface of the support member 11 are mounted on the support member 11. The pair of pressing plates 14 are formed in a substantially L shape seen from the side. In the pressing plate 14, a horizontal plate portion 41 abuts on the operation plate 3, and a vertical plate portion 42 abuts on the load sensor 13.

In this case, the vertical plate portion 42 of the pressing plate 14 has a pair of elastic arm portions 43 and applies an initial load (pre-tension) to the load sensor 13 using an elastic force of the pair of elastic arm portions 43. The horizontal plate portion 41 of the pressing plate 14 has a pair of extension portions 44 and is oscillatably supported, at the support member 11, by the pair of extension portions 44. The pressing plate 14 receives the operation load from the operation plate 3 on the horizontal plate portion 41 thereof and converts the direction of the operation load at substantially 90 degrees about the oscillating fulcrum. Thereby the pressing plate 14 causes a force to act in a direction opposite to the initial load acting on the load sensor 13.

In the pressing type input device 1 according to the embodiment, the operation load from the operation plate 3 acts so as to push back the pair of elastic arm portions 43, and therefore the initial load acting on the load sensor 13 is reduced. In addition, based on the load of each load sensor 13 which is output from the pressing type input device 1, the operation position or the operation load is calculated with respect to the operation plate 3. The operation position or the operation load is input to the portable terminal.

The operation plate 3 of an operation member has a lengthy shape formed of an elastic metal plate such as stainless steel or phosphor bronze. A pair of insertion holes 18 are formed on both end sides of the operation plate 3 in a longitudinal direction, and the operation plate 3 is fixed to the housing 2 by the pair of bolts 5 inserted into the pair of insertion holes 18. Therefore, the operation plate 3 functions as a plate spring bent downward, with both end sides fixed to the pair of bolts 5 as a fulcrum. On the operation plate 3, operation portions 19 regulating the operation positions at three points are provided in the longitudinal direction at the same intervals.

The operation plate 3 is bent so as to apply the operation load to the pair of pressing plates 14 when the operation portion 19 in the middle is pressed. In addition, the operation plate 3 is bent so as to apply the operation load to the pressing plate 14 on one side when the operation portion 19 on the one end side is pressed. Further, it may be configured that the operation load is applied only to the pressing plate 14 on the one side, and also it may be configured that the biased operation load is applied to the pressing plates 14 on both sides, when the operation portion 19 on the one end side is pressed. In addition, the operation portion 19 is formed of a translucent material and transmits light of a plurality of LEDs (Light Emitting Diodes) 15 provided in the flexible substrate 12 to the outside. Furthermore, the operation portion 19 is provided integrally with the elastic metal plate forming the operation plate 3, by using a double-sided adhesive tape or an insert molding. In addition, the operation plate 3 may be formed of a synthetic resin film having a translucency, integrally with the operation portion 19.

The support member 11 is formed by bending a metallic plate material such as stainless steel and has a side plate portion 21 in a lengthy shape, an upper plate portion 22 and a lower plate portion 23 extending from both upper and lower end portions of the side plate portion 21 in a front direction. The flexible substrate 12 provided with the load sensor 13 is adhered to a front surface of the side plate portion 21. A horizontal portion 25 is formed on the upper plate portion 22, corresponding to the mounting position of each pressing plate 14. In addition, a rise portion 26, which is cut and raised so as to be positioned slightly upward from the horizontal surface so as to interpose the horizontal portion 25 therebetween, is formed on the upper plate portion 22. Each pressing plate 14 is positioned in the longitudinal direction with respect to the upper plate portion 22, by the rise portion 26.

Locking holes 27 and 28 for mounting each pressing plate 14 are formed on the upper plate portion 22 and the lower plate portion 23 of the support member 11, corresponding to the mounting position of each pressing plate 14. The locking hole 27 of the upper plate portion 22 is a lengthy hole. The locking hole 27 locks the pressing plate 14 therein and functions as a window portion to emit the light of LED 15 to the outside. The locking hole 27 of the upper plate portion 22 is formed corresponding to the operation portion 19 of the operation plate 3. The light of the LED 15 is emitted to the outside of the device through the locking hole 27 and the operation portion 19.

The flexible substrate 12 is a substrate provided with the pair of load sensors 13, three LEDs 15 and an IC (Integrated Circuit) 16. The flexible substrate 12 is configured by forming a conductive pattern on a polyimide film as an insulating layer, for example. The flexible substrate 12 has a first extension portion 31 extending along the side plate portion 21 of the support member 11, and a second extension portion 32 extending in a direction perpendicular to the first extension portion 31. The first extension portion 31 is held in front of the side plate portion 21. The LEDs 15 and the load sensors 13 are alternately disposed along the longitudinal direction at the substantially same intervals on the first extending portion 31.

The second extension portion 32 protrudes from the middle part of the first extension portion 31 to the outside of the support member 11 via a long hole 29 formed on the support member 11 and is connected to a control portion (not shown) of the portable terminal. The IC 16 is disposed on the second extension portion 32. The IC 16 is connected to the load sensor 13 and the LED 15 and calculates the operation position or the operation load with respect to the operation plate 3, based on the output from each load sensor 13. Furthermore, the IC 16 controls the emission of the LED 15.

The load sensor 13 is a force sensor using piezoelectric ceramics, for example. The load sensor 13 is mounted on the side plate portion 21 of the support member 11 in a state where a detecting surface 35 having a protrusion for load-detecting is directed to the front side. Therefore, a detecting direction of the load sensor 13 is substantially perpendicular to an operation direction by the operation plate 3. The pressing plate 14 mounted on the support member 11 abuts on the detecting surface 35 of the load sensor 13, and the initial load from the pressing plate 14 is applied thereto.

The pressing plate 14 has a horizontal plate portion 41 and the vertical plate portion 42 and is formed in a substantially L shape seen from the side by bending a metallic plate material. The horizontal plate portion 41 is opposite to the operation plate 3 and has a pressed portion 45 receiving the operation load from the operation plate 3. A swelling portion 47 having a dome shape bulging on the operation plate 3 side is formed on the pressed portion 45. Since the pressing plate 14 receives the operation load from the operation plate 3 via the swelling portion 47, the operation load may be concentrated on the swelling portion 47. The swelling portion 47 constitutes a force point of the pressing plate 14 by abutting on a rear surface of the operation plate 3.

The pair of extension portions 44 extend along the longitudinal direction of the operation plate 3, from both sides of the pressed portion 45. Boundary parts between the pair of extension portions 44 and the pressed portion 45 is notched from the front side to the inner side. Curved portions 48 are respectively formed in the front of the pair of extension portions 44 partitioned by the notch, and curved portions 48 are formed in front of the pair of extending portions 44 partitioned by notches. The curved portion 48 extends in the longitudinal direction and is bent so as to bulge to the lower side. Therefore, the curved portion 48 constitutes an oscillating fulcrum of the pressing plate 14 by being placed on the horizontal portion 25 of the support member 11. Since The pressing plate 14 is supported at both sides thereof by the curved portions 48 of the pair of extension portions 44, oscillation of the pressing plate 14 is stabilized.

The vertical plate portion 42 is opposite to the side plate portion 21 of the support member 11 and has a press portion 46 to press the load sensor 13. A part of the press portion 46 constitutes an action point of the pressing plate 14 by abutting on the protrusion of the load sensor 13. The pair of elastic arm portions 43 extend along the longitudinal direction of the side plate portion 21, from both sides of the press portion 46. Locking pieces 49 to be locked to the support member 11 are respectively provided on free end sides of the pair of elastic arm portions 43. The locking pieces 49 extend in an up-down direction from the free end sides of the pair of elastic arm portions 43 and are inserted into the locking holes 27 and 28 formed on the upper plate portion 22 and the lower plate portion 23 of the support member 11.

When the free end sides of the pair of elastic arm portions 43 are locked to the support member 11, the press portion 46 is pulled to the load sensor 13 side. In this case, a connection section between the press portion 46 and the pressed portion 45 is entered in a notch 51 formed on the horizontal portion 25 of the support member 11 and abuts on a leading edge of the horizontal portion 25 forming the notch 51. In the top view, the leading edge of the horizontal portion 25 is positioned in a slightly forward direction than the locking holes 27 and 28. As a result, the pressing plate 14 is mounted on the support member 11 so as to be pulled to the leading edge of the upper plate portion 22 by an elastic force of the pair of elastic arm portions 43. The pressing plate 14 mounted on the support member 11 generates the initial load to the load sensor 13 via the press portion 46.

The pressing plate 14 configured as above causes the operation load from the operation plate 3 to act on the press portion 46, with the curved portion 48 as a fulcrum. In the press portion 46, the operation load from the operation plate 3 acts in a direction where the initial load is reduced with respect to the load sensor 13. In addition, a pair of regulating pieces 52 which face the rear surface of the horizontal portion 25 of the upper plate portion 22 are provided on base end sides of the pair of elastic arm portions 43. The pair of regulating pieces 52 regulate the oscillation of the pressing plate 14 within a predetermined range.

Figure 4A:
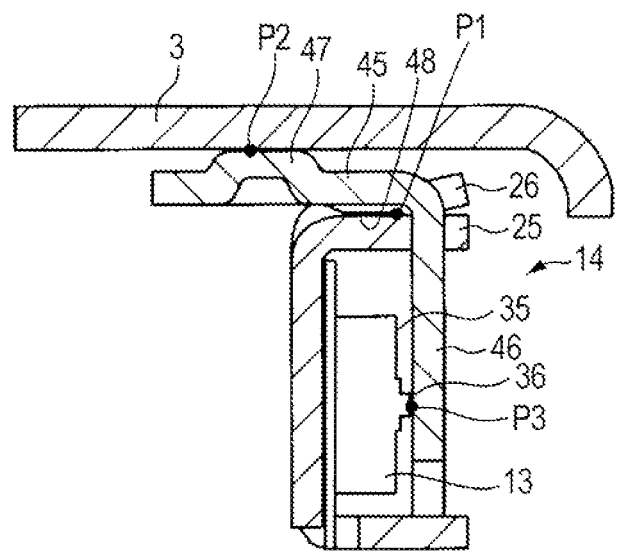
FIGS. 4A and 4B are explanatory views of transmission structures of a load by a pressing plate showing the first embodiment of the pressing type input device according to the present invention.
Figure 4B:
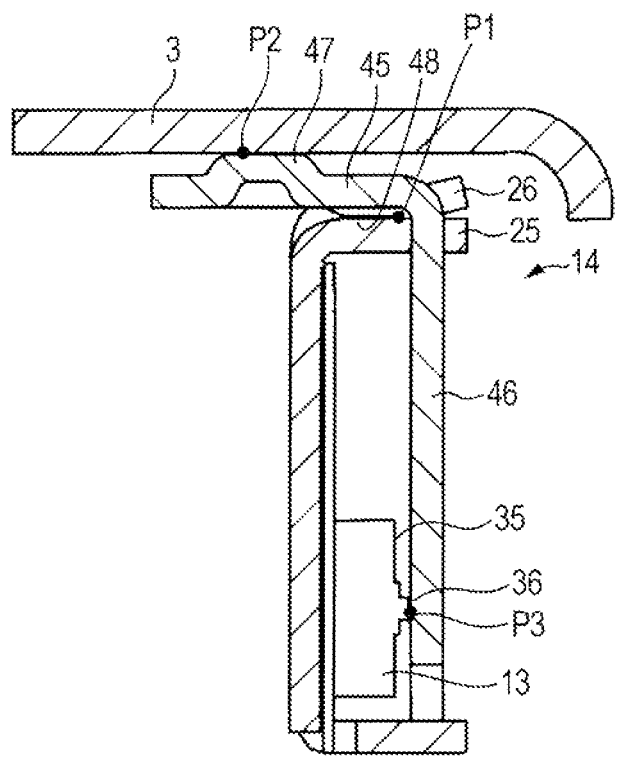

A transmission structure of a load by the pressing plate will be described with reference to FIGS. 4A and 4B. FIGS. 4A and 4B are explanatory views of the transmission structures of a load by the pressing plate according to the first embodiment of the invention. Further, a rate of the distance between the fulcrum and the force point and the distance between the fulcrum and the action point is changed differently in FIGS. 4A and 4B.

As shown in FIG. 4A, the pressing plate 14 is supported on an upper surface of the horizontal portion 25 by the curbed portions 48 of the pair of extension portions 44. In addition, the pressing plate 14 abuts on the rear surface of the operation plate 3 in the swelling portion 47 of the pressed portion 45 and abuts on a protrusion 36 of the load sensor 13 in the press portion 46. In other words, the pressing plate 14 functions as a lever having an L shape in which a support position P1 of the curved portion 48 is a fulcrum, a pressed position P2 of the swelling portion 47 is a force point, and a press position P3 of the press portion 46 is an action point. In this state, if the operation load from the operation plate 3 is applied to the swelling portion 47 of the pressing plate 14, the direction of the operation load is converted from the longitudinal direction to the lateral direction, with the curved portion 48 of the pressing plate 14 as a fulcrum.

At this time, the magnitude of the operation load acting on the action point of the press portion 46 is changed corresponding to the rate of the distance between the fulcrum and the force point and the distance between the fulcrum and the action point. In FIG. 4A, the rate of the distance between the support position P1 and the pressed position P2 and the distance between the support position P1 and the press position P3 is set to about 1:2. Therefore, the operation load from the operation plate 3 is reduced to about ½ and transmitted to the press position P3 of the press portion 46. Since the operation load transmitted to the press portion 46 acts in the direction opposite to the initial load, the initial load is reduced with respect to the load sensor 13.

Furthermore, it is possible to adjust detection accuracy and to adopt the load sensor 13 in various load ratings, by changing the rate of the distance between the fulcrum and the force point and the distance between the fulcrum and the action point. For example, it may be configured that the rate of the distance between the support position P1 and the pressed position P2 and the distance between the support position P1 and the press position P3 is set to about 1:5, as shown in FIG. 4B. In this case, the operation load from the operation plate 3 is reduced to about ⅕ and transmitted to the press portion 46. Therefore, it is possible to use the load sensor 13 having a relatively small load rating, and thus it is possible to improve design freedom of the pressing type input device 1. In addition, it is possible to enhance the detection accuracy, by causing the distance between the support position P1 and the press position P3 to be shorter than the distance between the support position P1 and the pressed position P2.

An input operation of the pressing type input device will be described with reference to FIGS. 5A and 5B. FIGS. 5A and 5B are explanatory views of the input operations of the pressing type input device according to the first embodiment of the present invention. In addition, FIG. 5A shows a non-operation state of the operation plate and FIG. 5B shows an operation state of the operation plate.

In the non-operation state of the operation plate 3, the press portion 46 is pulled to the load sensor 13 by an elastic force of the pair of elastic arm portions 43, with locking parts between the locking pieces 49 of the pair of elastic arm portions 43 and the locking holes 27 and 28 of the support member 11 as a base end side, as shown in FIG. 5A. The press portion 46 abuts on the protrusion 36 of the load sensor 13 in the press position P3. At this time, since the operation load is not applied to the operation plate 3, the elastic force of the pair of elastic arm portions 43, as an initial load F1, is applied to the load sensor 13, via the press portion 46.

In the non-operation state, when the operation plate 3 is pressed by an operation load F2, as shown in FIG. 5B, the direction of the operation load F2 is converted with the curved portion 48 of the pressing plate 14 as a fulcrum. Then the operation load F2 is transmitted to the press portion 46. At this time, the magnitude of the operation load F2 is changable corresponding to the rate of the distance between the support position P1 and the pressed position P2 and the distance of the support position P1 and the press position P3. The operation load F2 transmitted to the press portion 46 (press position P3) acts in the direction opposite to the pressing direction by the press portion 46. As a result, a pulling force of the pair of elastic arm portions 43 is loosened, and therefore a load F3 acts on the load sensor 13 in a state where the initial load F1 is reduced with respect to the load sensor 13.

Since the load acting on the load sensor 13 is reduced if the operation load is increased with respect to the operation plate 3, as described above, the load having the magnitude equal to or more than that of the initial load F1 does not act on the load sensor 13. Therefore, the load equal to or more than a load rating is prevented from being applied to the load sensor 13, and thus it is possible to prevent damage of the load sensor 13. The load sensor 13 receives the load from the press portion 46 and outputs a signal corresponding to the operation load to the IC 16.

The IC 16 calculates the operation position and the operation load with respect to the operation plate 3, in correspondence with an output value from the load sensor 13. For example, when the operation portion 19 in the middle of the operation plate 3 shown in FIG. 1 is pressed, the operation load is transmitted to the pair of pressing plates 14. In addition, if the operation portion 19 on one end side of the operation plate 3 is pressed, the operation load is transmitted to the pressing plate 14 on one side. The IC 16 specifies the operation position as the middle of the operation plate 3 if there are outputs from the pair of load sensors 13. Also, The IC 16 specifies the operation position as one end side of the operation plate 3 if there is an output only from the load sensors 13 on one side.

Therefore, if the load sensor 13 and the pressing plate 14 are set as a group in the pressing type input device 1 according to the embodiment, the operation positions are set at three points on the operation plate 3 by the two groups of the load sensors 13 and the pressing plates 14. Furthermore, the operation position and the operation load are calculated by the IC 16 provided in the flexible substrate 12, in the embodiment. However, the control portion of the portable terminal may calculate it.

When the pressing force to the operation plate 3 is released from the operation state shown in FIG. 5B, the operation load acting in the direction opposite to the pressing direction of the press portion 46 is removed. Then, an elastic force of the pair of elastic arm portions 43, as the initial load F1, is reapplied to the load sensor 13 via the press portion 46.

According to the pressing type input device 1 of the embodiment, the initial load acting on the load sensor 13 is reduced by the operation load from the operation plate 3, as described above. Therefore, it is possible to prevent the damage of the load sensor 13 even when overload is applied to the operation plate 3. In addition, it is possible to adopt the load sensor 13 in various load ratings, by changing at least one of the distances (namely, a rate between both distances) between the support position P1 and the pressed position P2 and between the support position P1 and the press position P3. Therefore, it is possible to improve design freedom. In addition, it is possible to set not only the position corresponding to the pressing plate 14 but also the operation position between the adjacent pressing plates 14, with respect to the operation plate 3. Furthermore, it is possible to reduce the number of load sensors 13 or the likes smaller than the number of operation positions set to the operation plate 3, and further the support member 11 is used in common. Therefore, it is possible to improve the productivity by reducing the number of parts.

In addition, in the embodiment described above, the pressing plate 14 is configured that the plate surface of the pressed portion 45 is substantially perpendicular to the plate surface of the press portion 46. However, the configuration is not limited thereto. The pressing plate 14 may be configured that the plate surface of the pressed portion 45 is opposite to the operation plate 3 and the plate surface of the press portion 46 is opposite to the detecting surface 35 of the load sensor 13.

Further, in the embodiment described above, it is configured that the initial load is generated to the load sensor 13 by the pair of plate-spring shaped elastic arm portions 43 as a biasing member, via the press portion 46. However, the configuration is not limited thereto. The biasing member may have any configuration as long as it causes the initial load to be generated to the load sensor 13 via the press portion 46. In addition, the biasing member is not limited to an integrally formed one on the pressing plate 14 and may be formed separately from the pressing plate 14.

Further, in the embodiment described above, it is configured that the pressing plate 14 is oscillatably supported by making the pair of extension portions 44 supported by the support member 11. However, the configuration is not limited thereto. It may be configured that the pressing plate 14 does not have the pair of extension portions 44 and the position supported by the support member 11 is provided in the pressed portion 45.

Still further, in the embodiment described above, it is configured that the pressing plate 14 functions as a lever having a substantially L shape, by the swelling portion 47, the curved portion 48 and a part of the press portion 46. However, the configuration is not limited thereto. The pressing plate 14 may have any configuration as long as it functions as a lever having a substantially L shape.

Further, in the embodiment described above, the operation position of the operation plate 3 is set to the position corresponding to the pair of pressing plates 14 and the position between the pair of pressing plates 14. However, the configuration is not limited thereto. The operation position of the operation plate 3 may be set only to the position corresponding to the pair of pressing plates 14 or may be set over the entire operation plate 3.

Figure 6:
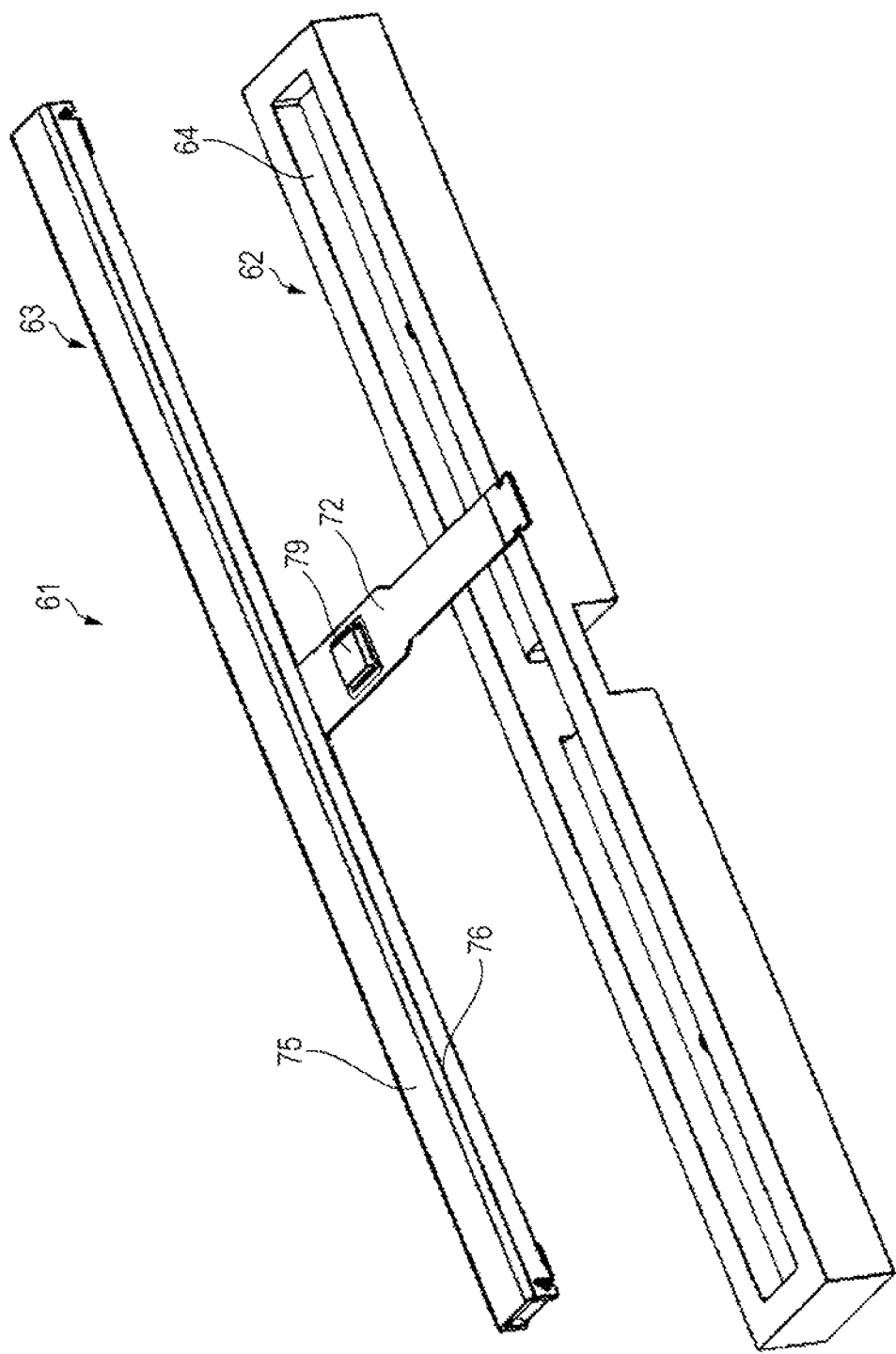
FIG. 6 is a perspective view of a pressing type input device showing a second embodiment of the pressing type input device according to the present invention.
Figure 7:
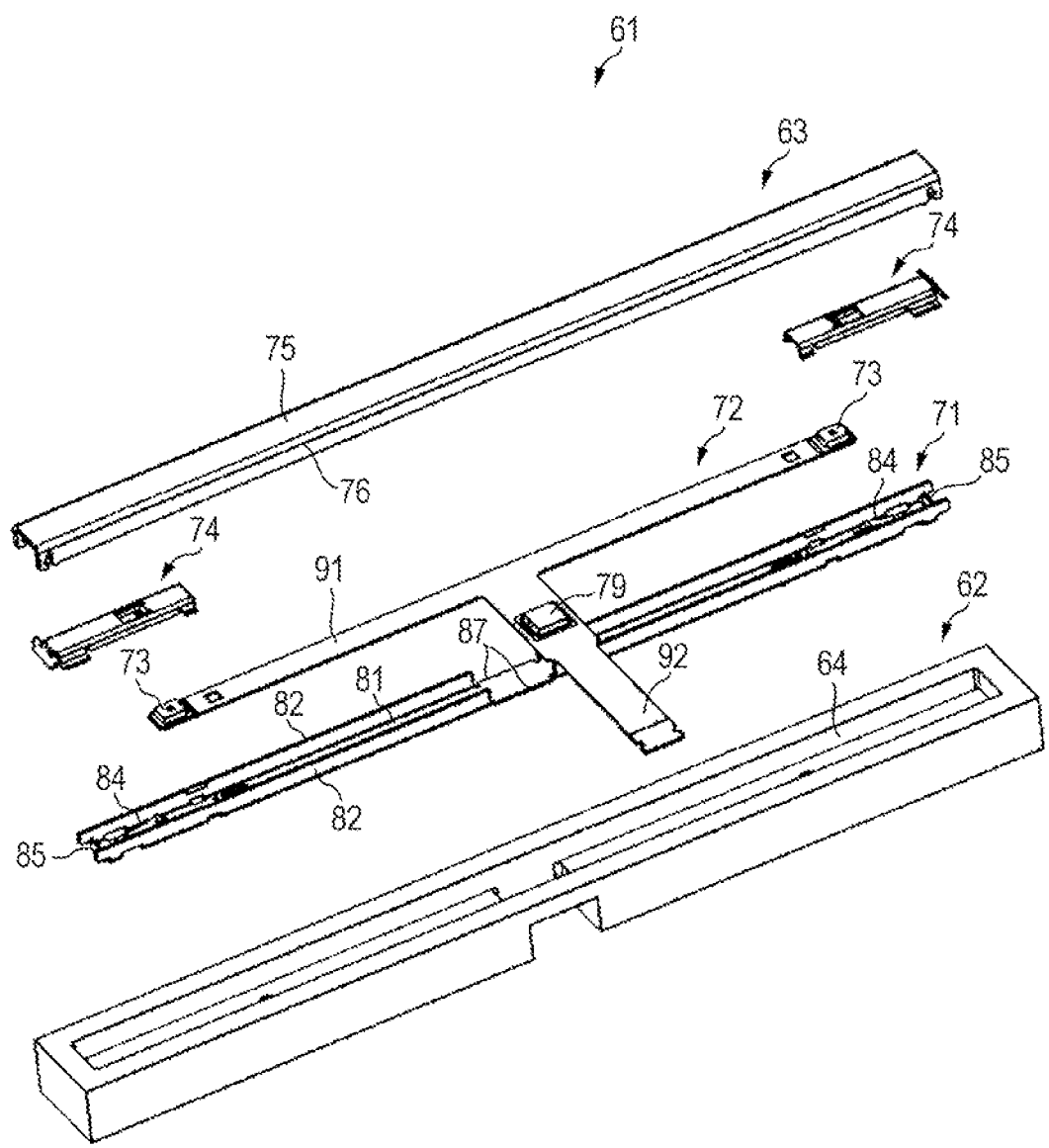
FIG. 7 is an exploded perspective view of the pressing type input device showing the second embodiment of the pressing type input device according to the present invention.
Figure 8A:
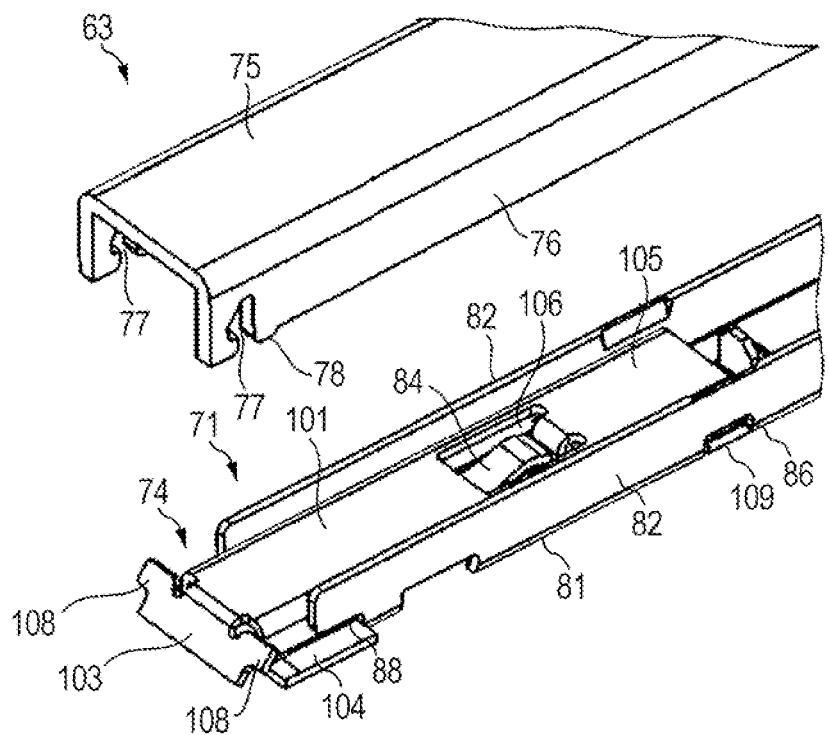
FIGS. 8A and 8B are partially enlarged views of the pressing type input device showing the second embodiment of the pressing type input device according to the present invention.
Figure 8B:
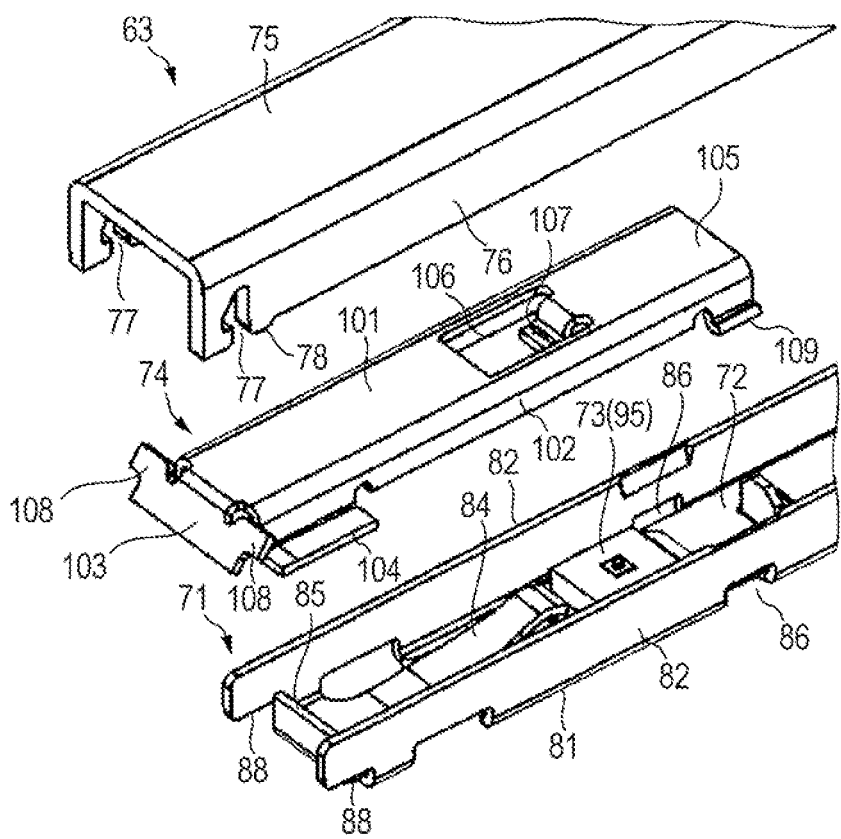

Next, a second embodiment of the present invention will be described with reference to FIGS. 6 to 10B. FIG. 6 is a perspective view of a pressing type input device according to the second embodiment of the present invention. FIG. 7 is an exploded perspective view of the pressing type input device according to the second embodiment of the present invention. FIGS. 8A and 8B are partially enlarged views of the pressing type input device according to the second embodiment of the present invention. FIG. 8A shows a state where the pressing plate is mounted on the support member, and FIG. 8B shows a state where the pressing plate is removed from the support member.

As shown in FIGS. 6 to 8B, a pressing type input device 61 is mounted on a housing 62 of a portable terminal and has a configuration capable of inputting the operation position or the operation load with respect to an operation plate 63 to the portable terminal. The pressing type input device 61 is disposed in an accommodation portion 64 of the housing 62 and covered by the operation plate 63 which covers the accommodation portion 64 from outside thereof.

The pressing type input device 61 has a channel-shaped (groove-shaped) support member 71 having a box shape in cross-sectional view of which an upper surface is opened. A pair of load sensors 73 are mounted on an inner bottom surface of the support member 71, via a flexible substrate 72. In addition, a pair of pressing plates 74 which press each load sensor 73 provided on the inner bottom surface of the support member 71 are mounted on the support member 71. The pair of pressing plates 74 have a lengthy shape. In the pressing plate 74, one end thereof abuts on an operation plate 63 and the other end abuts on the load sensor 73.

In this case, the other end of the pressing plate 74 is pulled to the load sensor 73 by an elastic arm portion 84 provided on the support member 71 and causes an initial load (pre-tension) to be applied to the load sensor 73. The one end of the pressing plate 74 is oscillatably supported on the support member 71, by a support plate portion 85 of the support member 71. The pressing plate 74 receives an operation load from the operation plate 63 on the one end side thereof, whereby causing a force to act in a direction opposite to the initial load acting on the load sensor 73, with an oscillating fulcrum as a center.

In the pressing type input device 61 according to the embodiment, the operation load from the operation plate 63 acts so as to push back the elastic arm portion 84, and therefore the initial load acting on the load sensor 73 is reduced. In addition, based on the load of each load sensor 73 output from the pressing type input device 61, the operation position or the operation load with respect to the operation plate 63 is calculated. Therefore, the operation position or the operation load is input to the portable terminal.

The operation plate 63 is formed by bending a metallic plate such as stainless steel and has an upper plate portion 75 having a lengthy shape and a pair of side plate portions 76 extending downward from both end portions in a width direction of the upper plate portion 75. On both end portions of the pair of side plate portions 76 in a longitudinal direction, locking holes 77 locked on one end side of the pressing plate 74 are respectively formed from lower end portions of the pair of side plate portions 76 to upward side in a notched manner. In addition, abutment portions 78 abutting on one end side of the pressing plate 74 are provided on lower end portions of the pair of side plate portions 76, in a state of being adjacent to the locking holes 77.

The support member 71 is formed by bending a metallic plate material such as stainless steel and has a bottom plate portion 81 having lengthy shape and a pair of side plate portions 82 rising both end portions of the bottom plate portion 81 in a width direction. An outer surface spacing between the pair of side plate portions 82 of the support member 71 is formed to be narrower than an inner surface spacing between the pair of side plate portions 76 of the operation plate 63. Therefore, the support member 71 is covered by the operation plate 63 so as to cover the pair of side plate portions 82 from outside thereof. The flexible substrate 72 mounted with the load sensor 73 is adhered on an upper surface of the bottom plate portion 81.

The pair of elastic arm portions 84 extending toward a center in the longitudinal direction are formed on both end sides of the bottom plate portion 81 in the longitudinal direction. Each of the elastic arm portions 84 is a cantilever spring which is cut and raised from the bottom plate portion 81. The elastic arm portion 84 acts so as to causes the other end of the pressing plate 74 to be pulled to the load sensor 73, via a locking portion 107 described below. The support plate portion 85 supporting the pressing plate 74 is formed by bending, in a direction substantially perpendicular to the upper surface, both end portions of the bottom plate portion 81 in the longitudinal direction. A positioning hole 86 for positioning the pressing plate 74 is formed on the bottom plate portion 81, corresponding to the other end of the pressing plate 74.

The flexible substrate 72 is a substrate provided with the pair of load sensors 73 and an IC (Integrated Circuit) 79. The flexible substrate 72 is configured by forming a conductive pattern on a polyimide film as an insulating layer, for example. The flexible substrate 72 has a first extension portion 91 extending along the bottom plate portion 81 of the support member 71, and a second extension portion 92 extending in a direction perpendicular to the first extension portion 91. The first extension portion 91 is held on the upper surface of the bottom plate portion 81. The pair of load sensors 73 are disposed on both end portions of the first extension portion 91 in the longitudinal direction.

The second extension portion 92 protrudes from the middle part of the first extension portion 91 to the outside of the support member 71 via a notch 87 formed on the support member 71 and is connected to a control portion (not shown) of the portable terminal. The IC 79 is disposed on the second extension portion 92. The IC 79 is connected to the pair of load sensors 73 and calculates the operation position or the operation load with respect to the operation plate 63, based on the output from each load sensor 73.

The load sensor 73 is a force sensor using piezoelectric ceramics, for example. The load sensor 13 is mounted on the bottom plate portion 81 of the support member 71 while a detecting surface 95 having a protrusion for load-detecting is directed upward. Therefore, a detecting direction of the load sensor 73 is substantially the same with an operation direction by the operation plate 63. Also, the acting direction of a force is opposite to a pressing-operation direction with respect to the operation plate 63. The pressing plate 74 mounted on the support member 71 abuts on the detecting surface 95 of the load sensor 73, and the initial load from the pressing plate 74 is applied thereto.

The pressing plate 74 is formed by bending a metallic plate material such as stainless steel and has a plate portion 101 having a lengthy shape, a pair of side plate portions 102 extending downward from both end portions of the plate portion 101 in a width direction, and an inclined plate portion 103 continuous to one end portion of the plate portion 101 in the longitudinal direction. An outer surface spacing between the pair of side plate portions 102 of the pressing plate 74 is formed to be narrower than an inner surface spacing between the pair of side plate portions 82 of the support member 71. Therefore, the pressing plate 74 is disposed inside of the pair of side plate portions 82 of the support member 71.

A pair of pressed portions 104 which extend in the width direction outwardly from a lower end portion are respectively provided on one ends of the pair of side plate portions 102. Each pressed portion 104 extends to the outside of the pair of side plate portions 82 of the support member 71, via notches 88 formed on both end portions of the support member 71 in the longitudinal direction. Each pressed portion 104 is opposite to the operation plate 63 in the outside of the pair of side plate portions 82 and abuts on the abutment portion 78 of the operation plate 63. A part of the pressed portion 104 constitutes a force point of the pressing plate 74 by abutting on the abutment portion 78 of the operation plate 63.

One end of the plate portion 101 is placed on an upper end surface of the support plate portion 85 erected in the support member 71. A part of the plate portion 101 supported by the support plate portion 85 constitutes an oscillating fulcrum of the pressing plate 74. Since the one end of the plate portion 101 is supported over the width direction thereof by the upper end surface of the support plate portion 85, oscillation of the pressing plate 74 is stabilized. The other end of the plate portion 101 is opposite to the bottom plate portion 81 of the support member 71 substantially parallel to the pressed portion 104 and forms a pressed portion 105 pressing the load sensor 73. A part of the press portion 105 abuts on the protrusion of the load sensor 73 and constitutes an action point of the pressing plate 74.

An opening 106 having a rectangular shape is formed in a substantially middle portion of the plate portion 101. The locking portion 107 extends from an edge portion on the press portion 105 side, which forms the opening 106, toward an inner side, on the opening 106. A tip of the locking portion 107 is locked in a free end of the elastic arm portion 84 extending from the support member 71. When the locking portion 107 is locked in the free end of the elastic arm portion 84, the press portion 105 is pulled to the load sensor 73 side. The pressing plate 74 generates an initial load to the load sensor 73 via the press portion 105, by an elastic force of the elastic arm portion 84.

A pair of locking pieces 108 to be inserted into the locking holes 77 of the operation plate 63 are provided in the inclined plate portion 103. The pressing plate 74 is mounted on the operation plate 63 by inserting the pair of locking pieces 108 into the locking holes 77. In this case, the pair of locking pieces 108 are engaged with the locking holes 77 with a play. Therefore, a hindrance due to the engagement between the locking pieces 108 and the locking holes 77 does not occur with respect to the press by the operation plate 63 with respect to the pressed portion 104 of the pressing plate 74. Furthermore, the locking hole 77 is formed by notching the lower end portion of the side plate portion 76 of the operation plate 63. However, since the width of the lower end portion is narrow, the locking piece 108 is prevented from falling off the locking hole 77.

The pressing plate 74 configured as above causes the operation load from the operation plate 63 to act on the press portion 105, with a support position by the support member 71 as a fulcrum. In this case, the operation load from the operation plate 63 acts in a direction where the initial load with respect to the load sensor 73 is reduced in the press portion 105. Furthermore, a pair of positioning pieces 109 inserted into the pair of positioning holes 86 of the support member 71 are provided on the other end sides of the pair of side plate portions 102 of the pressing plate 74. the pressing plate 74 is mounted in a state of being positioned with respect to the support member 71 by inserting the pair of positioning pieces 109 into the pair of positioning holes 86 of the support member 71.

In this case, the pair of positioning pieces 109 are engaged with the positioning hole 86 with a slight play in an up-down direction. Therefore, a hindrance due to the engagement between the positioning pieces 109 and the positioning holes 86 does not occur to the oscillation of the pressing plate 74 with respect to the support member 71. In addition, the pressing plate 74 in a state of being positioned described above is improved in rigidity, by the pair of side plate portions 102. Therefore, detection accuracy of the load sensor 73 is prevented from being deteriorated due to the displacement of the pressing plate 74 with respect to the support member 71, the bending of the pressing plate 74 or the like.

A transmission structure of a load by the pressing plate will be described with reference to FIGS. 9A and 9B. FIGS. 9A and 9B are explanatory views of the transmission structures of a load by the pressing plate according to the second embodiment of the present invention. Further, a rate of the distance between the fulcrum and the force point and the distance between the fulcrum and the action point is changed in FIGS. 9A and 9B.

In one end of the plate portion 101, the pressing plate 74 is supported on an upper end surface of the support plate portion 85, as shown in FIG. 9A. In addition, the pressing plate 74 abuts on the abutment portion 78 of the operation plate 63, in the pressed portion 104 and abuts on a protrusion 96 of the load sensor 73, in the press portion 105. In other words, the pressing plate 74 functions as a lever of which a fulcrum is the support position P1 on one end side of the plate portion 101, a force point is the pressed position P2 of the pressed portion 104 and an action point is the pressed position P3 of the press portion 105. In this state, when the operation load from the operation plate 63 is applied to the pressed portion 104 of the pressing plate 74, oscillation by the support member 71 of the pressing plate 74 occurs with the support position P1 as a fulcrum.

In this case, the magnitude of the operation load acting on the action point of the press portion 105 is changed correspondingly to the rate of the distance between the fulcrum and the force point and the distance between the fulcrum and the action point. In FIG. 9A, the rate of the distance between the support position P1 and the pressed position P2 and the distance between the support position P1 and the press position P3 is set to about 1:3. Therefore, the operation load from the operation plate 63 is reduced to about ⅓ and transmitted to the press position P3 of the press portion 105. Since the operation load transmitted to the press portion 105 acts in the direction opposite to the initial load, the initial load is reduced with respect to the load sensor 73.

Furthermore, it is possible to adjust detection accuracy and to adopt the load sensor 73 in various load ratings, by changing the rate of the distance between the fulcrum and the force point and the distance between the fulcrum and the action point. For example, it may be configured that the rate of the distance between the support position P1 and the pressed position P2 and the distance between the support position P1 and the press position P3 is set to about 1:5, as shown in FIG. 9B. In this case, the operation load from the operation plate 63 is reduced to about ⅕ and transmitted to the press position P3 of the press portion 105. Therefore, it is possible to use the load sensor 73 having a relatively small load rating, and thus it is possible to improve design freedom of the pressing type input device 61.

In addition, it is possible to enhance the detection accuracy, by causing the distance between the support position P1 and the press position P3 to be shorter than the distance between the support position P1 and the pressed position P2. Furthermore, in the pressing plate 74, the press position P3 of the press portion 105 is set in the vicinity of the locking portion 107. Therefore, it is possible to reduce the plate thickness and width of the elastic arm portion 84, by lengthening the elastic arm portion 84.

An input operation of the pressing type input device will be described with reference to FIGS. 10A and 10B. FIGS. 10A and 10B are explanatory views of the input operation of the pressing type input device according to the second embodiment of the present invention. Further, FIG. 10A shows a non-operation state of the operation plate and FIG. 10B shows an operation state of the operation plate.

In the non-operation state of the operation plate 63, the press portion 105 is pulled to the load sensor 73 by an elastic force of the elastic arm portion 84, as shown in FIG. 10A. The press portion 105 abuts on the protrusion 96 of the load sensor 73 in the press position P3. At this time, since the operation load is not applied to the operation plate 63, the elastic force of the elastic arm portions 84 is applied to the load sensor 73 as an initial load F1, via the press portion 105.

In the non-operation state, when the operation plate 63 is pressed by the operation load F2, as shown in FIG. 10B, the operation load is transmitted to the press portion 105, with the support position P1 supported by the support plate portion 85 as a fulcrum. At this time, the magnitude of the operation load F2 is changable corresponding to the rate of the distance between the support position P1 and the pressed position P2 and the distance of the support position P1 and the press position P3. The operation load F2 transmitted to the press portion 105 (press position P3) acts in the direction opposite to the pressing direction by the press portion 105. As a result, a pulling force of the elastic arm portion 84 is loosened, and therefore a load F3 acts on the load sensor 73 in a state where the initial load F1 is reduced.

Since the load acting on the load sensor 73 is reduced if the operation load is increased with respect to the operation plate 63, as described above, the load having the magnitude equal to or more than that of the initial load F1 does not act on the load sensor 73. Therefore, the load equal to or more than a load rating is prevented from being applied to the load sensor 73, and therefore it is possible to prevent damage of the load sensor 73. The load sensor 73 receives the load from the press portion 105 and outputs a signal corresponding to the operation load to the IC 79.

The IC 79 calculates the operation position and the operation load with respect to the operation plate 63, in correspondence with an output value from the load sensor 73. For example, the IC 79 specifies the operation position and the operation load in the operation plate 63, base on the rate of the output values from each load sensor 73. Therefore, it is possible to set the operation position to be along the longitudinal direction of the operation plate 63, in the pressing type input device 61 according to the embodiment. Furthermore, in the embodiment, the operation position and the operation load are calculated by the IC 79 provided in the flexible substrate 72. However, the control portion of the portable terminal may calculate it.

When the pressing force with respect to the operation plate 63 is released from the operation state shown in FIG. 10B, the operation load acting in the direction opposite to the pressing direction of the press portion 105 is removed. Then, the elastic force of the elastic arm portion 84 is reapplied to the load sensor 73 via the press portion 105, as the initial load F1.

According to the pressing type input device 61 of the embodiment, the initial load acting on the load sensor 73 is reduced by the operation load from the operation plate 63, as described above. Therefore, it is possible to prevent the damage of the load sensor 73 even when overload is applied to the operation plate 63. In addition, it is possible to adopt the load sensor 73 in various load ratings, by changing at least one of the distances (namely, a rate between both distances) between the support position P1 and the pressed position P2 and between the support position P1 and the press position P3. Therefore, it is possible to improve design freedom. In addition, it is possible to cause the operation load to act on the load sensor 73 without changing the direction from the operation plate 63. Therefore, it is possible for the pressing type input device to have a simpler design. Furthermore, the support member 71 is used in common in the pressing plate 74 and the load sensor 73, and therefore it is possible to improve the productivity by reducing the number of parts.

In addition, in the embodiment described above, the pressing plate 74 is configured that the plate surface of the pressed portion 104 is substantially parallel to the plate surface of the press portion 105. However, the configuration is not limited thereto. The pressing plate 74 may be configured that the plate surface of the pressed portion 104 is opposite to the operation plate 63 and the plate surface of the press portion 105 is opposite to the detecting surface 95 of the load sensor 73.

Further, in the embodiment described above, it is configured that the initial load is generated to the load sensor 73 by the plate-spring shaped elastic arm portion 84 as a biasing member, via the press portion 105. However, the configuration is not limited thereto. The biasing member may have any configuration as long as it causes the initial load to be applied to the load sensor 73 via the press portion 105. In addition, the biasing member is not limited to an integrally formed one on the pressing plate 74 and may be formed separately from the pressing plate 74.

Further, in the embodiment described above, it is configured that the pressing plate 74 functions as a lever, by a part of the pressed portion 104, a part of the plate portion 101 and a part of the press portion 105. However, the configuration is not limited thereto. The pressing plate 74 may have any configuration as long as it functions as a lever.

Still further, in the embodiment described above, the operation position of the operation plate 63 is set over the entire operation plate 63. However, the configuration is not limited thereto. The operation position of the operation plate 63 may be set only to the position corresponding to the pair of pressing plates 74 or to the position corresponding to the pair of pressing plates 74 and the position between the pair of pressing plates 74 in the same manner as in the first embodiment.

Hereinafter, a third embodiment of the present invention will be described in detail with reference to accompanying drawings. Furthermore, a pressing type input device mounted on a touch-type display device will be described in the following description. However, applicable objects of the pressing type input devices according to the embodiment are not limited thereto and can be modified appropriately.

Figure 11:
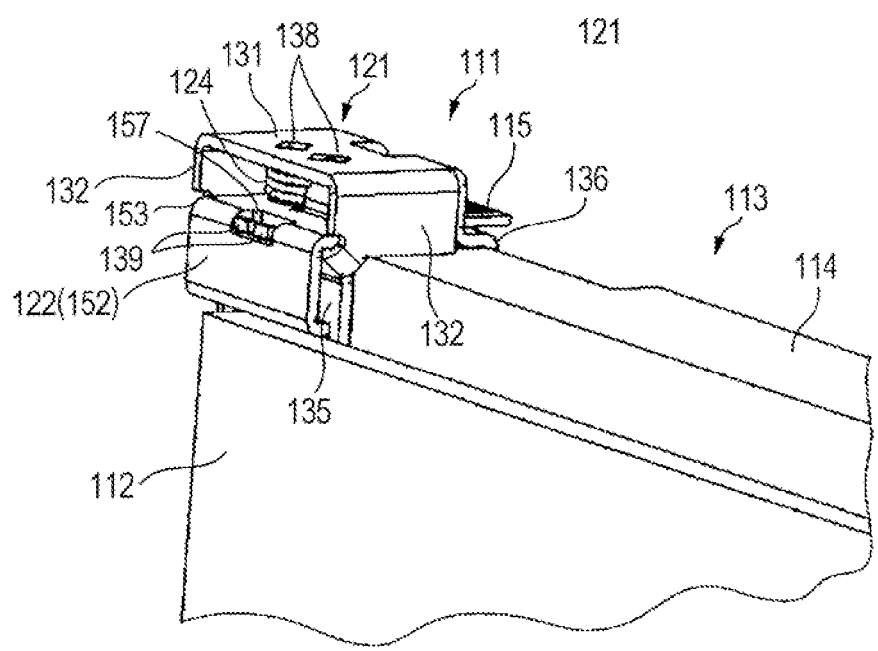
FIG. 11 is a perspective view of a pressing type input device showing a third embodiment of the pressing type input device according to the present invention.
Figure 12:
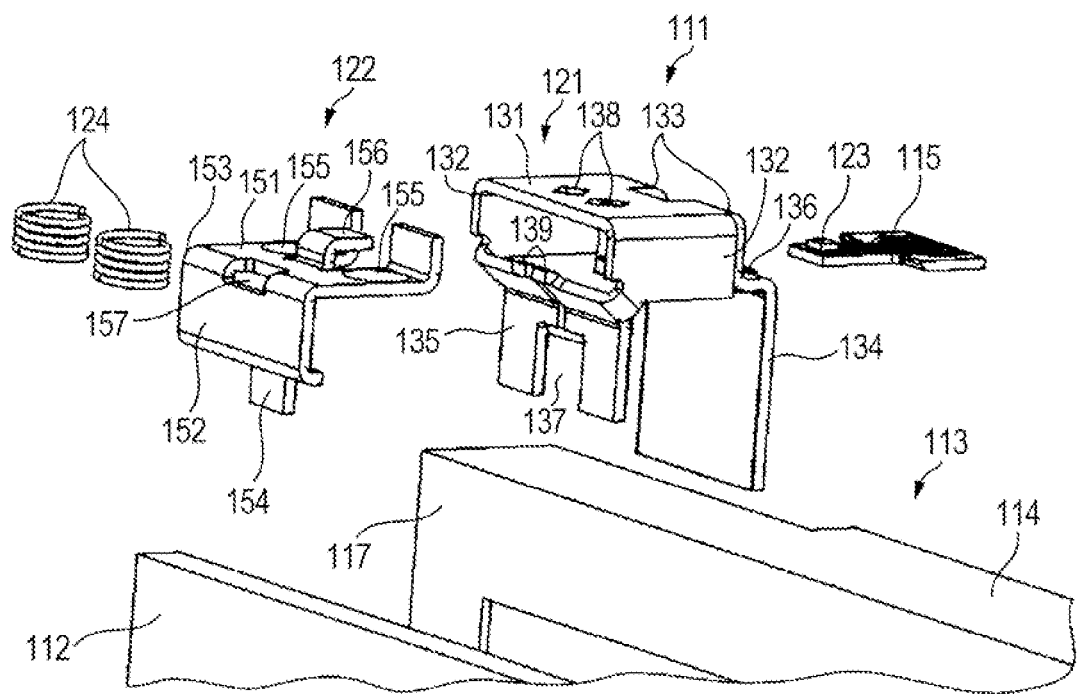
FIG. 12 is an exploded perspective view of the pressing type input device showing the third embodiment of the pressing type input device according to the present invention.
Figure 13:
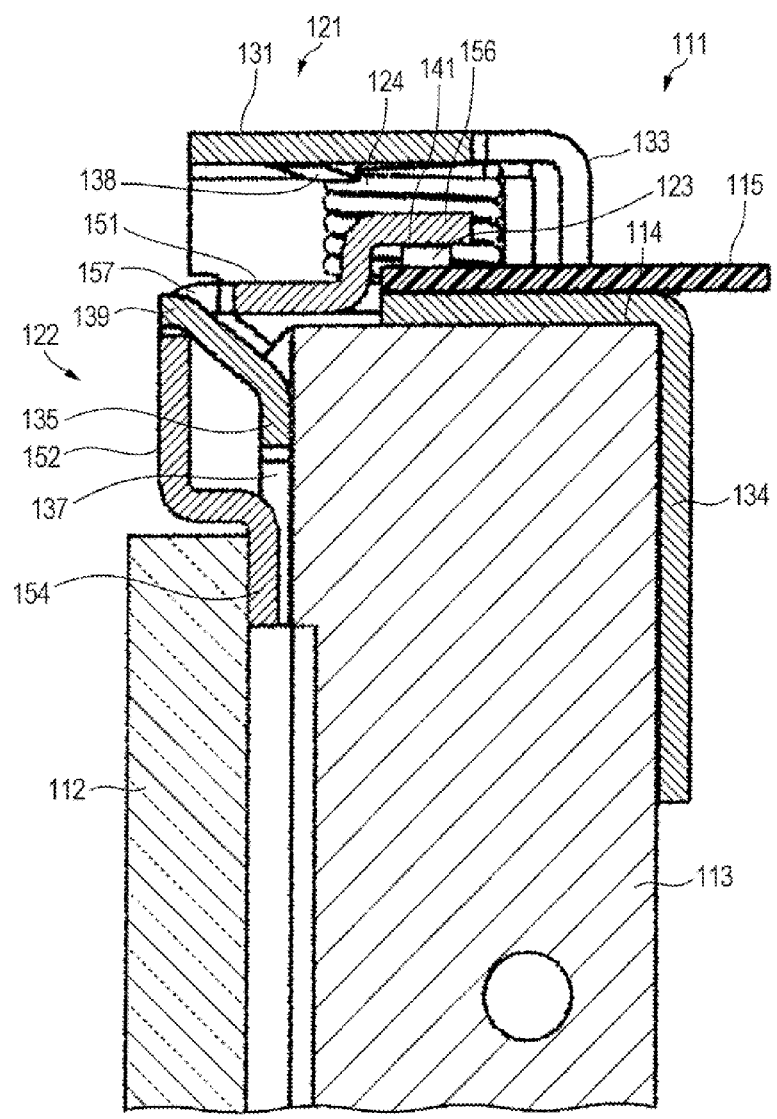
FIG. 13 is a cross-sectional view of the pressing type input device showing the third embodiment of the pressing type input device according to the present invention.

A whole structure of the pressing type input device will be described with reference to FIGS. 11 to 13. FIG. 11 is a perspective view of the pressing type input device according to the third embodiment of the present invention. FIG. 12 is an exploded perspective view of the pressing type input device according to the third embodiment of the present invention. FIG. 13 is a cross-sectional view of the pressing type input device according to the third embodiment of the present invention.

As shown in FIGS. 11 to 13, an liquid crystal display device has a configuration in which a operation panel 112 is disposed on a front surface of an LCD (Liquid Crystal Display) 113 via a plurality (for example, six) of pressing type input devices 111 disposed around the LCD 113. The plurality of pressing type input devices 111 are mounted on a side portion of the LCD 113 and has a configuration capable of inputting the operation position or the operation load with respect to the operation panel 112 to the LCD 113. Furthermore, in this case, the LCD 113 may be a unit including a liquid crystal display and a control circuit (control portion) thereof.

The pressing type input device 111 has a support member 121 mounted on the LCD 113 via a double-side tape. In the support member 121, a printed circuit board 115 is disposed parallel to a side surface 114 of the LCD 113 and a detecting surface 141 of a load sensor 123 provided on the printed circuit board 115 is disposed substantially perpendicular to an operation surface of the operation panel 112. A pressing plate 122 to press the load sensor 123 is mounted on the support member 121. The pressing plate 122 has a substantially L shape in side view. Also, the pressing plate 122 abuts on the operation panel 112 in a vertical plate portion 152 opposite to the front surface of the LCD 113 and abuts on the load sensor 123 in a horizontal plate portion 151 opposite to the side surface 114 of the LCD 113.

In addition, the support member 121 has a plate portion 131 opposite to the horizontal plate portion 151 of the pressing plate 122. A pair of coil springs 124 are disposed between the plate portion 131 and the horizontal plate portion 151 of the pressing plate 122, and an initial load (pre-tension) is applied to the load sensor 123 by the pair of coil springs 124. The pressing plate 122 is oscillatably supported with respect to the support member 121, in a corner portion 153 between the vertical plate portion 152 and the horizontal plate portion 151. The pressing plate 122 receives the operation load from the operation plate 112 on the vertical plate portion 152 and converts the direction of the operation load at substantially 90 degrees about the oscillating fulcrum as a center. Thereby the pressing plate 122 causes a force to act in a direction opposite to the initial load acting on the load sensor 123.

In the pressing type input device 111 according to the embodiment, the operation load from the operation panel 112 acts so as to push back the coil spring 124, and therefore the initial load acting on the load sensor 123 is reduced. In addition, based on the load of each load sensor 123 which is output from the pressing type input device 111, the operation position or the operation load is calculated with respect to the operation panel 112. The operation position or the operation load is input to the LCD 113.

The operation panel 112 of the operation member is formed in a rectangular shape using tempered glass, for example, and is disposed to cover a screen of the LCD 113. In addition, the operation panel 112 may be made of any material as long as it has transparency, for example, and may be formed of synthetic resin such as acrylic.

The support member 121 is formed by bending a metallic plate material such as stainless steel and has the plate portion 131 opposite to the side surface 114 of the LCD 113 and a pair of side plate portions 132 extending downward from both end portions of the plate portion 131 in the width direction. A rear plate portion 134 which is adhered on a rear surface of the LCD 113 via a pair of connection portions 133 is provided on a rear side (right side in FIG. 13) of the plate portion 131. A pair of front plate portions 135 which are adhered on a front surface 117 of the LCD 113 are provided on a front-lower side of the pair of side plate portions 132. The pair of front plate portions 135 are inclined such that substantially upper half portions thereof inclinedly abut on the corner portion 153 of the pressing plate 122. Also, substantially lower half portions thereof are substantially parallel to the front surface 117 of the LCD 113.

The support member 121 forms a space having a front-opened box shape by being mounted on the LCD 113. The printed circuit board 115 is disposed on the support member 121 so as to be substantially parallel to the side surface 114 of the LCD 113. In the printed circuit board 115, a base end thereof is disposed on a stepped portion 136 formed between the pair of connection portions 133 and the rear plate portion 134 and a tip end thereof is disposed in the support member 121 in a state of passing through the pair of connection portions 133. The load sensor 123 is disposed on the tip end side of the printed circuit board 115. In addition, a horizontal plate portion 151 of the pressing plate 122 and the pair of coil springs 124 are accommodated in the support member 121.

The load sensor 123 is a force sensor using piezoelectric ceramics, for example. The load sensor 123 is disposed in the support member 121 in a state where the detecting surface 141 having a protrusion for load-detecting is directed to the upper side. Therefore, a detecting direction of the load sensor 123 is substantially perpendicular to an operation direction by the operation panel 112. The pressing plate 122 mounted on the support member 121 abuts on the detecting surface 141 of the load sensor 123, and the initial load from the pressing plate 122 is applied thereto.

The pressing plate 122 is formed in a substantially L shape in side view in the manner of bending a metallic plate material and has the vertical plate portion 152 and the horizontal plate portion 151. The vertical plate portion 152 is opposite to the pair of front plate portions 135 of the support member 121 and has a pressed portion 154 to receive the operation load from the operation panel 112. The pressed portion 154 is disposed in a notch 137 formed in the substantially lower half portions of the pair of front plate portions 135 of the support member 121. The pressed portion 154 constitutes a force point of the pressing plate 122 by abutting on the rear surface of the operation panel 112.

The horizontal plate portion 151 is opposite to the plate portion 131 of the support member 121 and has a pair of spring support portions 155 to support the pair of coil springs 124 and a press portion 156 to press the load sensor 123. The pair of spring support portions 155 interpose the pair of coil springs 124 between the spring support portions 155 and the plate portion 131 of the support member 121, in both end sides of the horizontal plate portion 151 in the width direction. The tip end sides of the pair of spring support portions 155 are bent upward and support the side surfaces of the coil springs 124. An accommodation space for the pair of coil springs 124 is formed in the support member 121 by the pair of spring support portions 155, the plate portion 131 of the support member 121 and the pair of side plate portions 132.

The front side of the accommodation space for the pair of coil springs 124 is open. The pair of coil springs 124 are pushed inward from the front open side of the accommodation space. Therefore, it is easy to perform an installation work and a replacement work of the pair of coil springs 124 with respect to the pressing type input device 111. One ends of the pair of coil springs 124 in the accommodation space abut on the plate portion 131, and the other ends thereof abut on the pair of spring support portions 155. In addition, the pair of coil springs 124 are held by retaining portions 138 which are cut and raised from the plate portion 131 of the support member 121 toward the accommodation space.

The press portion 156 is provided between the pair of spring support portions 155 and formed so as to be opposite to the tip end of the printed circuit board 115 provided with the load sensor 123. A part of the press portion 156 constitutes a force point of the pressing plate 122 by abutting on the protrusion of the load sensor 123. The horizontal plate portion 151 is pulled to the load sensor 123 side by a spring force of the pair of coil springs 124 and generates the initial load to the load sensor 123 via the press portion 156.

The corner portion 153 of the pressing plate 122 constitutes an oscillating fulcrum of the pressing plate 122 by abutting on an inclined section of the front plate portion 135 of the support member 121. Since the corner portion 153 of the pressing plate 122 is supported, over the width direction, by the inclined section of the front plate portion 135, oscillation of the pressing plate 122 is stabilized. In addition, a locking hole 157 in which a locking piece 139 protruding from the inclined section of the front plate portion 135 of the support member 121 is formed on the corner portion 153 of the pressing plate 122. The locking hole 157 regulates the oscillation of the pressing plate 122 within a predetermined range by being locked to the locking piece 139.

The pressing plate 122 configured as above causes the operation load from the operation panel 112 to act on the press portion 156, with the position supported by the front plate portion 135 of the support member 121 as a fulcrum. In the press portion 156, the operation load from the operation plate 112 acts in a direction where the initial load with respect to the load sensor 123 is reduced.

Figure 14A:
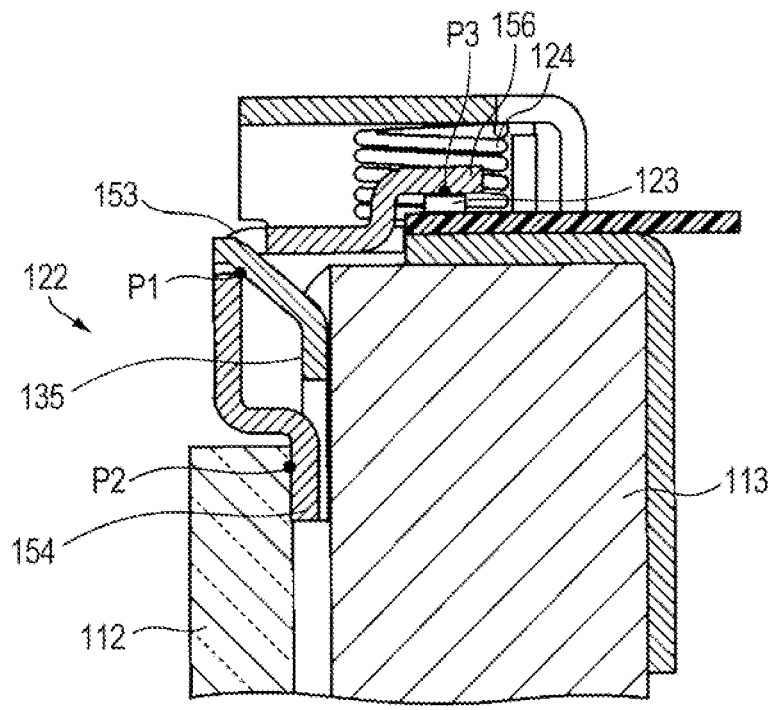
FIGS. 14A and 14B are explanatory views of transmission structures of a load by a pressing plate showing the third embodiment of the pressing type input device according to the present invention.
Figure 14B:
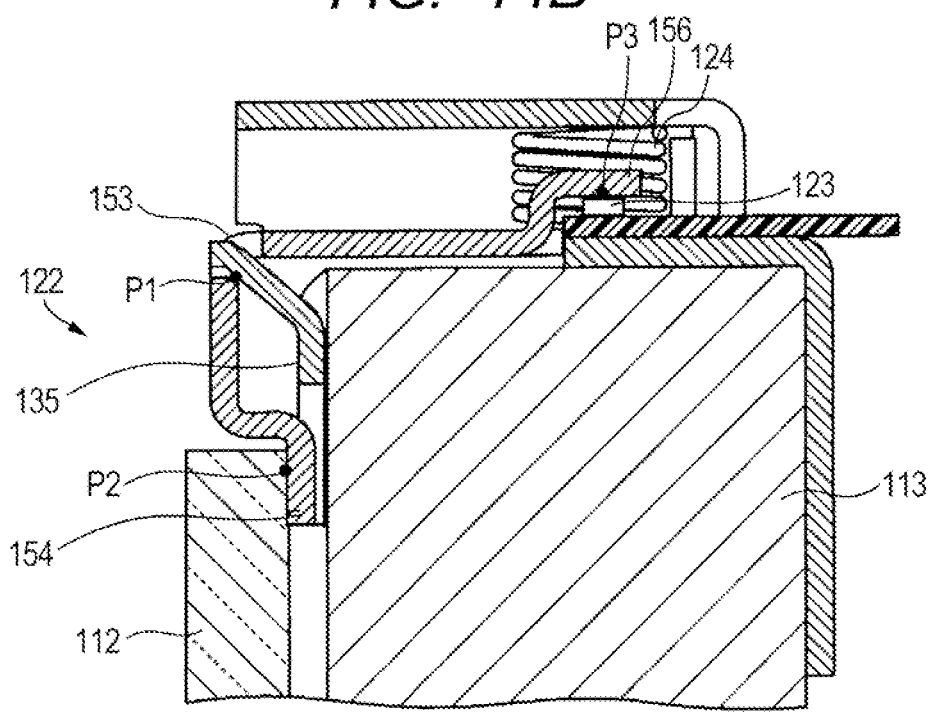

A transmission structure of the load by the pressing plate will be described with reference to FIGS. 14A and 14B. FIGS. 14A and 14B are explanatory views of the transmission structures of the load by the pressing plate according to the third embodiment of the present invention. Furthermore, a rate of the distance between the fulcrum and the force point and the distance between the fulcrum and the action point is changed differently in FIGS. 14A and 14B.

As shown in FIG. 14A, the pressing plate 122 is supported by the inclined section of the front plate portion 135, in the corner portion 153. In addition, the pressing plate 122 abuts on the rear surface of the operation panel 112 in the pressed portion 154 and abuts on the protrusion of the load sensor 123 in the press portion 156. In other words, the pressing plate 122 functions as a lever having an L shape in which the support position P1 of the corner portion 153 is a fulcrum, the pressed position P2 of the pressed portion 154 is a force point, and the press position P3 of the press portion 156 is an action point. In this state, if the operation load from the operation panel 112 is applied to the pressing plate 122, the direction of the operation load is converted from the front-rear direction to the up-down direction, with the corner portion 153 of the pressing plate 122 as a fulcrum.

At this time, the magnitude of the operation load acting on the action point of the press portion 156 is changed corresponding to the rate of the distance between the fulcrum and the force point and the distance between the fulcrum and the action point. In FIG. 14A, the rate of the distance between the support position P1 and the pressed position P2 and the distance between the support position P1 and the press position P3 is set to about 1:1. Therefore, the operation load from the operation plate 112 is transmitted to the press position P3 of the press portion 156, without being changed substantially. Since the operation load transmitted to the press portion 156 acts in the direction opposite to the initial load, the initial load with respect to the load sensor 123 is reduced.

Furthermore, it is possible to enhance detection accuracy and to adopt the load sensor 123 in various load ratings, by changing the rate of the distance between the fulcrum and the force point and the distance between the fulcrum and the action point. For example, it may be configured that the rate of the distance between the support position P1 and the pressed position P2 and the distance between the support position P1 and the press position P3 is set to about 1:2, as shown in FIG. 14B. In this case, the operation load from the operation panel 112 is reduced to about ½ and transmitted to the press position P3 of the press portion 156. Therefore, it is possible to use the load sensor 123 having a relatively small load rating, and thus it is possible to improve design freedom of the pressing type input device 111. In addition, it is possible to enhance the detection accuracy, by causing the distance between the support position P1 and the press position P3 to be shorter than the distance between the support position P1 and the pressed position P2.

Figure 15A:
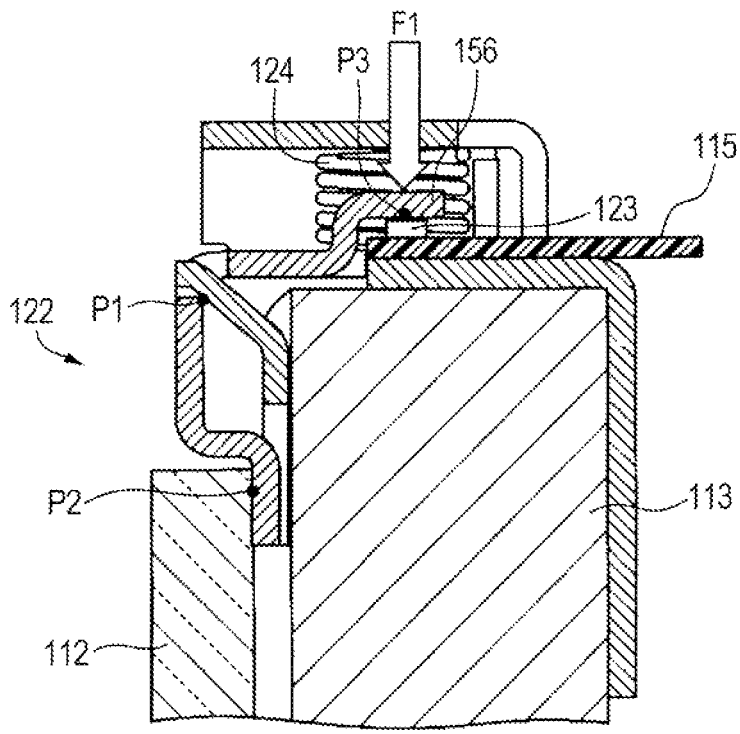
FIGS. 15A and 15B are explanatory views of input operations of the pressing type input device showing the third embodiment of the pressing type input device according to the present invention.
Figure 15B:
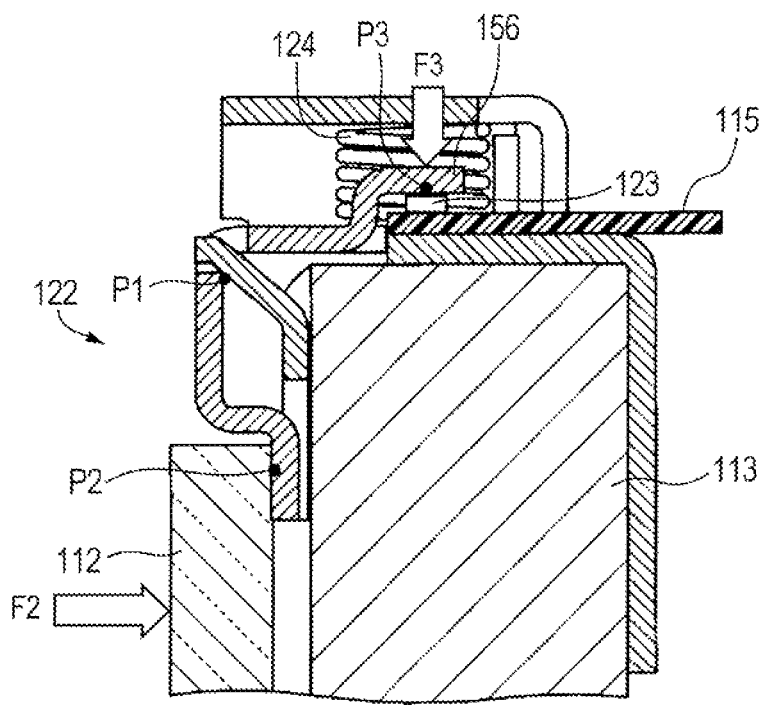

An input operation of the pressing type input device will be described with reference to FIGS. 15A and 15B. FIGS. 15A and 15B are explanatory views of the input operations of the pressing type input device according to the third embodiment of the present invention. In addition, FIG. 15A shows a non-operation state of the operation panel and FIG. 5B shows an operation state of the operation plate.

In the non-operation state of the operation panel 112, the press portion 156 is pulled to the load sensor 123 by a spring force of the pair of coil springs 124, as shown in FIG. 15A. The press portion 156 abuts on the protrusion of the load sensor 123 in the press position P3. At this time, since the operation load is not applied to the operation panel 112, the spring force of the pair of coil springs 124, as an initial load F1, is applied to the load sensor 123, via the press portion 156.

In the non-operation state, when the operation plate 3 is pressed by an operation load F2, as shown in FIG. 15B, the direction of the operation load F2 is converted with the corner portion 153 of the pressing plate 122 as a fulcrum. Then the operation load F2 is transmitted to the press portion 156. The operation load F2 transmitted to the press portion 156 (press position P3) acts in the direction opposite to the pressing direction by the press portion 156. As a result, a pulling force of the pair of coil springs 124 is loosened, and therefore a load F3 acts on the load sensor 123 in a state where the initial load F1 is reduced with respect to the load sensor 123.

Since the load acting on the load sensor 132 is reduced if the operation load is increased with respect to the operation panel 112, as described above, the load having the magnitude equal to or more than that of the initial load F1 does not act on the load sensor 123. Therefore, the load equal to or more than a load rating is prevented from being applied to the load sensor 123, and thus it is possible to prevent damage of the load sensor 123. The load sensor 123 receives the load from the press portion 156 and outputs a signal corresponding to the operation load to an IC (not shown) of the printed circuit board 115.

The IC of the printed circuit board 115 calculates the operation position and the operation load with respect to the operation panel 112, in correspond with an output value from the load sensor 123. For example, the IC specifies the operation position and the operation load in the operation panel 112, based on the rate of the output values from the plurality of load sensors 123 disposed around the operation panel 112. Therefore, it is possible for the pressing type input device 111 according to the embodiment to set the operation position thereof in a plane of the operation panel 112. Furthermore, the operation position and the operation load are calculated by the IC provided in the printed circuit board 115, in the embodiment. However, the control portion of the LCD 113 may calculate it.

When the pressing force to the operation panel 112 is released from the operation state shown in FIG. 15B, the operation load acting in the direction opposite to the pressing direction of the press portion 156 is removed. Then, an elastic force of the pair of coil springs 124, as the initial load F1, is reapplied to the load sensor 123 via the press portion 156.

According to the pressing type input device 111 of the embodiment, the initial load acting on the load sensor 123 is reduced by the operation load from the operation panel 112, as described above. Therefore, it is possible to prevent the damage of the load sensor 123 even when overload is applied to the operation panel 112. In addition, it is possible to adopt the load sensor 123 in various load ratings, by changing at least one of the distances (namely, a rate between both distances) between the support position P1 and the pressed position P2 and between the support position P1 and the press position P3. Therefore, it is possible to improve design freedom.

In addition, in the embodiment described above, the pressing plate 122 is configured that the plate surface on the pressed portion 154 side is substantially perpendicular to the plate surface of the press portion 156. However, the configuration is not limited thereto. The pressing plate 122 may be configured that the plate surface on the pressed portion 154 side is opposite to the operation panel 112 and the plate surface on the press portion 156 is opposite to the detecting surface 141 of the load sensor 123.

Further, in the embodiment described above, it is configured that the initial load is generated to the load sensor 123 by the pair of coil springs 124 as a biasing member, via the press portion 156. However, the configuration is not limited thereto. The biasing member may have any configuration as long as it causes the initial load to be generated to the load sensor 123 via the press portion 156. In addition, the biasing member is not limited to a separately formed type and may be formed integrally with the pressing plate 122.

Further, in the embodiment described above, it is configured that the pressing plate 122 functions as a lever having a substantially L shape, by a part of the pressed portion 154, the curved portion 153 and a part of the press portion 156. However, the configuration is not limited thereto. The pressing plate 122 may have any configuration as long as it functions as a lever having a substantially L shape.

In addition, in the embodiment described above, the operation position of the operation panel 112 is set over the entire operation panel 112. However, the configuration is not limited thereto. The operation position of the operation panel 112 may be set only to the position corresponding to the pair of pressing plates 122 or to the position corresponding to the pair of pressing plates 122 and the position between the pair of pressing plates 122 in the same manner as in the first embodiment.

In addition, the pressing member is a pressing plate formed by bending a metallic plate material, in the first to third embodiments described above. However, the pressing member is not limited thereto. The pressing member may be any member as long as it presses a load sensor by receiving a biasing force from a biasing member. For example, the pressing member may be made of a synthetic resin or the like. Furthermore, the pressed portion or the press portion is not necessarily formed in a plate shape having a flat plate surface. For example, it may be formed in a spherical shape or a convex shape aside from the spherical shape.

In addition, the support member is formed by bending a metallic plate material, in the first to third embodiments described above. However, the pressing member is not limited thereto. The support member may be any member as long as it oscillatably supports a pressing member. For example, the support member may be made of a synthetic resin or the like.

Further, it is configured that a support member supports a pressing member at only one surface side thereof, in the first to third embodiments described above. However, it may be configured that the support member supports the pressing member at the front and rear surface sides thereof.

Still further, the embodiments disclosed in this application are exemplifications of the present invention, in all respects. The present invention is not limited to the embodiments. The scope of the present invention is indicated by the claims rather than by the description of the embodiments described above. Also, the scope of the present invention includes meanings equivalent to the claims and all modification without departing from the gist of the claims.

It should be understood by those skilled in the art that various modifications, combinations, sub-combinations and alterations may occur depending on design requirements and other factors insofar as they are within the scope of the appended claims of the equivalents thereof.

What is claimed is:

1. A pressing type input device comprising:
   a load sensor configured to output a signal corresponding to an operation load applied thereto from an operation member;
   a biasing member configured to provide an initial load to the load sensor;
   a pressing member configured to press the load sensor by receiving a biasing force from the biasing member; and
   a support member which rockably supports the pressing member,
   wherein the pressing member includes:
      a pressed portion configured to receive the operation load from the operation member; and
      a pressing portion configured to press the load sensor, and
   wherein the operation load applied to the pressed portion causes a force to act on the pressing portion in a direction to reduce the initial load on the load sensor, a position of the pressing member supported by the support member serving as a fulcrum for the force applied to the pressing portion.

2. The pressing type input device according to claim 1, wherein the position supported by the support member is located between the pressed portion and the pressing portion.

3. The pressing type input device according to claim 1, wherein the load sensor has a detecting surface oriented in a direction substantially perpendicular to an operation direction of the operation member, and
   wherein the pressing member has a plate shape, the pressed portion has a first plate surface facing the operation member, and the pressing portion has a second plate surface facing the detecting surface, the second plate surface being substantially perpendicular to the first plate surface.

4. The pressing type input device according to claim 3, wherein the biasing member includes a pair of elastic arm portions extending from the pressing portion to both sides of a connection portion of the pressed portion and the pressing portion,
   wherein the support member includes a pair of locking portions configured to lock free ends of the pair of elastic arm portions, and
   wherein the pair of elastic arm portions, with the free ends thereof being locked in the pair of locking portions, pull the pressing portion toward the load sensor side so as to generate the initial load.

5. The pressing type input device according to claim 3, wherein the pressing member includes a pair of extension portions extending from the pressed portion to both sides of the connection portion of the pressed portion and the pressing portion, the pair of extension portions being supported by the support member.

6. The pressing type input device according to claim 3, comprising:
   a plurality of sets, each including the load sensor, the pressing member, and the biasing member, the support member being commonly shared by the plurality of sets,
   wherein the input device is configured to identify, in the operation member, a first operation position corresponding to the pressing member and a second operation position corresponding to an in-between position of the adjacent pressing members, based on outputs from a plurality of the load sensors.

7. The pressing type input device according to claim 1, wherein the load sensor has a detecting surface oriented in the operation direction of the operation member, and
   wherein the pressing member has a plate shape, the pressed portion has a first plate surface facing the operation member, and the pressing portion has a second plate surface facing the detecting surface, the second plate surface being substantially parallel to the first plate surface.

8. The pressing type input device according to claim 7, wherein the biasing member is an elastic arm portion extending from the support member toward the pressing portion,
   wherein the pressing member includes a locking portion configured to lock a free end of the elastic arm portion, and
   wherein the elastic arm portion, with the free end thereof being locked in the locking portion, pulls the pressing portion toward the load sensor side so as to generate the initial load.

9. The pressing type input device according to claim 7, wherein the support member is provided with a positioning hole for positioning the pressing member, and
   wherein the pressing member is formed of a plate material, the pressing member including:
      a plate surface having an elongated shape;
      a pair of opposing surfaces formed continuously from both ends of the plate surface along a longitudinal direction thereof, the pair of opposing surfaces being substantially perpendicular to the plate surface; and
      a positioning piece configured to be positionably held in the positioning hole.

10. The pressing type input device according to claim 7, comprising:
    a plurality of sets, each including the load sensor, the pressing member, and the biasing member, the support member being commonly shared by the plurality of sets,
    wherein the input device is configured to specify an operation position in the operation member based on a ratio of the outputs from the plurality of the load sensors.

11. The pressing type input device according to claim 1, wherein the load sensor has a detecting surface oriented in a direction substantially perpendicular to an operation direction of the operation member, and
    wherein the pressing member has a plate shape, the pressing member including:
       a first plate surface provided on the pressed portion side with respect to the fulcrum, the first plate facing the operation member; and
       a second plate surface provided on the pressing portion side with respect to the fulcrum, the second plate surface being substantially perpendicular to the first plate surface and facing the detecting surface of the load sensor.

12. The pressing type input device according to claim 11, wherein the biasing member is a spring coil having a first end abutting the second plate surface, and a second end abutting a plate surface of the support member facing the second plate surface, and
    wherein the spring coil is configured to press the pressing portion against the load sensor by a spring force thereof so as to apply the initial load.

13. The pressing type input device according to claim 12, wherein an accommodation space for the coil spring is formed by the second plate surface of the pressing member and the plate surface of the support member, the accommodation space having an open end.

14. The pressing type input device according to claim 11, comprising:
- a plurality of sets, each including the load sensor, the pressing member, the biasing member, and the support member,
- wherein the input device is configured to specify an operation position of the operation member based on a ratio of outputs from a plurality of the load sensors.

* * * * *